United States Patent
Zhang et al.

(10) Patent No.: US 10,740,514 B1
(45) Date of Patent: Aug. 11, 2020

(54) GRAPH-BASED PARTITIONING OF DYNAMIC SYSTEM EXECUTION

(71) Applicant: The MathWorks, Inc., Natick, MA (US)

(72) Inventors: Fu Zhang, Sherborn, MA (US); Robert O. Aberg, South Grafton, MA (US); Murali K. Yeddanapudi, Lexington, MA (US); John E. Ciolfi, Wellesley, MA (US); Pieter J. Mosterman, Framingham, MA (US); Zhi Han, Acton, MA (US)

(73) Assignee: The MathWorks, Inc., Natick, MA (US)

( * ) Notice: Subject to any disclaimer, the term of this patent is extended or adjusted under 35 U.S.C. 154(b) by 785 days.

(21) Appl. No.: 14/189,591

(22) Filed: Feb. 25, 2014

(51) Int. Cl.
*G06F 17/50* (2006.01)
*G06F 30/23* (2020.01)

(52) U.S. Cl.
CPC .................................. *G06F 30/23* (2020.01)

(58) Field of Classification Search
None
See application file for complete search history.

(56) References Cited

U.S. PATENT DOCUMENTS

| | | | |
|---|---|---|---|
| 7,167,817 B2 | 1/2007 | Mosterman et al. | |
| 8,756,562 B2 | 6/2014 | Ciolfi et al. | |
| 8,990,783 B1 | 3/2015 | Yu et al. | |
| 9,354,846 B2 | 5/2016 | Zhang et al. | |
| 9,377,998 B2 | 6/2016 | Han et al. | |
| 9,411,559 B2 | 8/2016 | Avadhanula et al. | |
| 2009/0178025 A1* | 7/2009 | Morrow | G06F 8/34 717/109 |
| 2012/0197617 A1* | 8/2012 | Mujagic | G06F 17/5027 703/7 |

OTHER PUBLICATIONS

Derek Rowell, "2.14 Analysis and Design of Feedback Control Systems, State-Space Representation of LTI Systems." Oct. 2002.*
Reicherdt (Reicherdt, Robert, and Sabine Glesner. "Slicing MATLAB simulink models." Proceedings of the 34th International Conference on Software Engineering. IEEE Press, 2012.) (Year: 2012).*
Simulink, Simulation and Model-Based Design, "Using Simulink", Version 6, The Mathworks, (Sep. 2005). (Year: 2005).*
"Simulink® User's Guide," R2013a, The MathWorks, Inc., Mar. 2013, pp. 1-2983.

* cited by examiner

*Primary Examiner* — Bijan Mapar
(74) *Attorney, Agent, or Firm* — Cesari and McKenna, LLP

(57) ABSTRACT

A device may receive a model that includes multiple blocks. The model may include first variables that contribute to a first calculation and second variables that contribute to a second calculation. The device may determine first dependencies associated with the first variables and may determine second dependencies associated with the second variables. The device may generate a first execution function based on determining the first dependencies. The first execution function may identify first blocks that are to be executed to perform the first calculation. The device may generate a second execution function based on determining the second dependencies. The second execution function may identify second blocks that are to be executed to perform the second calculation. The device may cause the first blocks and the second blocks to be executed in a different manner based on the first execution function and the second execution function.

21 Claims, 20 Drawing Sheets

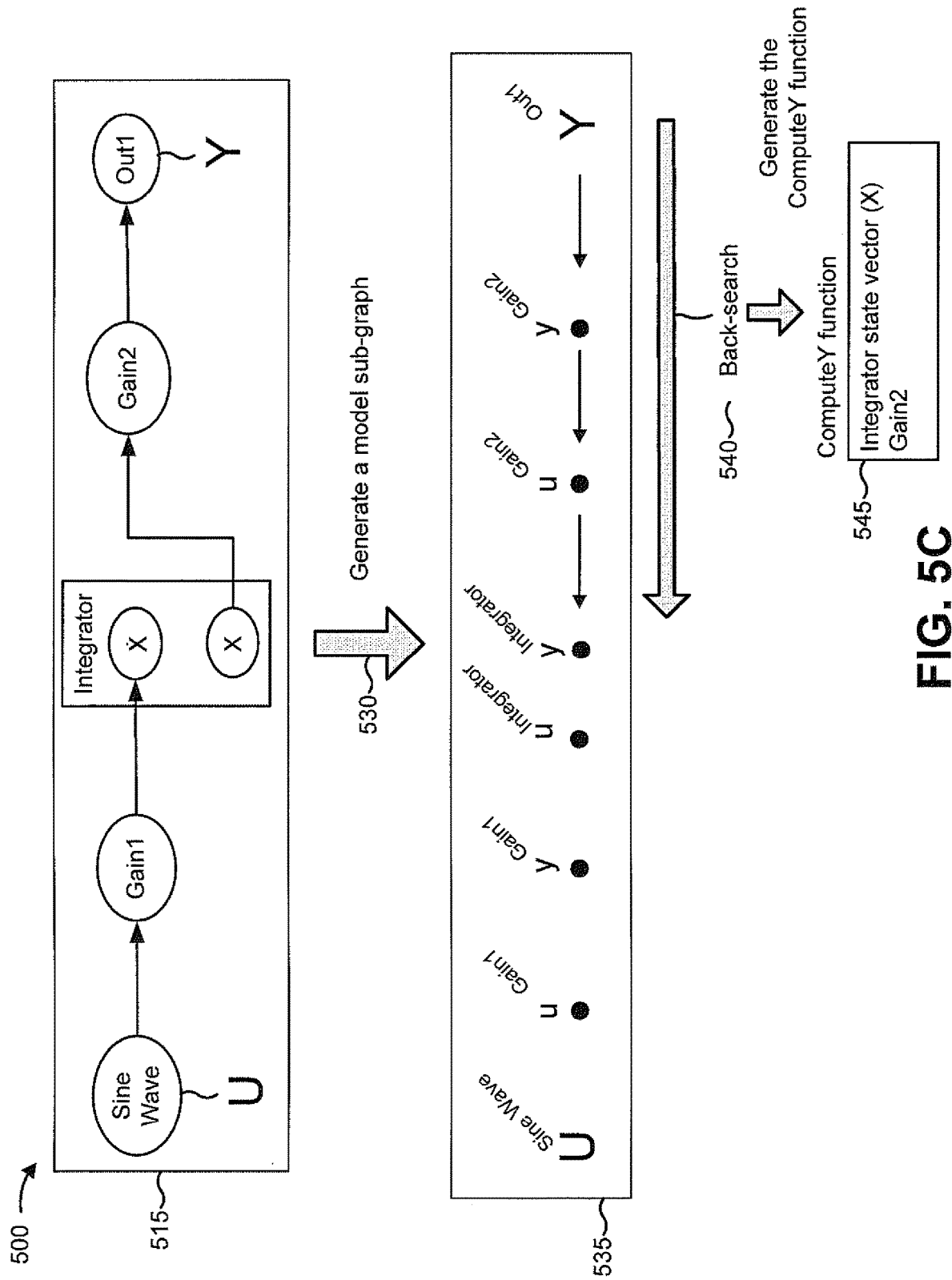

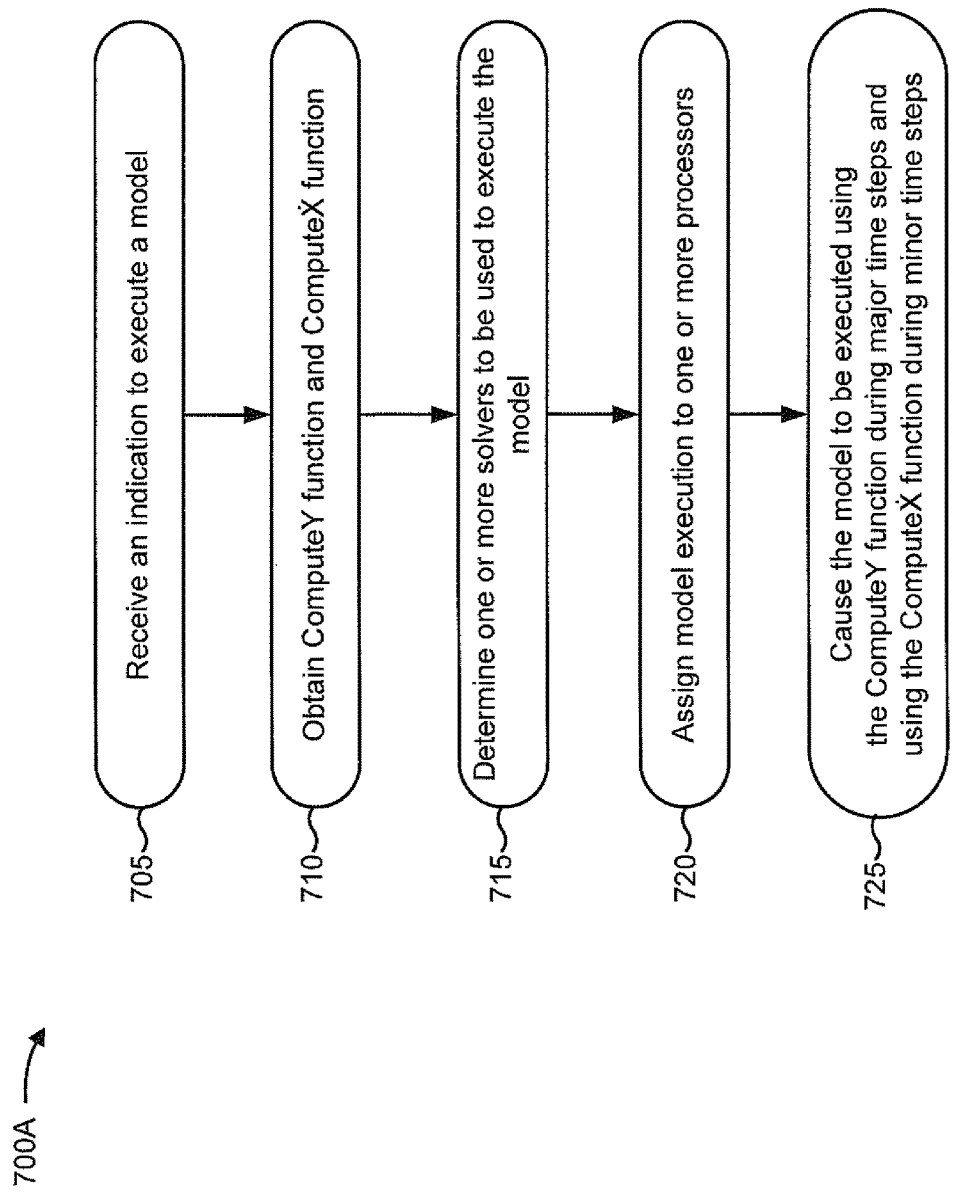

```
/* Outputs for root system: '<Root>' */
void MdlOutputs()
{
    /* local block i/o variables */
    real_T rtb_temp;

/* Integrator: '<Root>/Integrator' */
    rtb_temp = rtX.Integrator_CSTATE;

/* Outport: '<Root>/Out1' incorporates:
     * Gain1: '<Root>/Gain2'
     */
    rtY.Out1 = rtP.Gain2_Gain1 * rtb_temp;

/* Sin: '<Root>/Sine Wave' */
    rtb_temp = sin(rtP.SineWave_Freq * ssGetT(rtS) + rtP.SineWave_Phase) *
        rtP.SineWave_Amp + rtP.SineWave_Bias;

/* Gain1: '<Root>/Gain1' */
    rtB.Gain = rtP.Gain1_Gain1 * rtb_temp;

/* Outport: '<Root>/Out2' */
    rtY.Out2 = rtB.Gain1;
}

/* Derivatives for root system: '<Root>' */
void MdlDerivatives()
{
    /* Derivatives for Integrator: '<Root>/Integrator' */
    ((XDot *) ssGetdX(rtS))->Integrator_CSTATE = rtB.Gain1;
}
```

FIG. 9B

```
/* These are the output of Sine wave and Gain, they will be
reused for both ComputeY1 and ComputeXdot */
void ComputeYatBothMinorAndMajorTime()
{
    real_T rtb_S1;
    /* Sin: '<Root>/Sine Wave' */
    rtb_S1 = sin(rtP.SineWave_Freq * ssGetT(rtS) +
                 rtP.SineWave_Phase) *
            rtP.SineWave_Amp + rtP.SineWave_Bias;

/* Gain1: '<Root>/Gain1' */
    rtB.Gain1 = rtP.Gain1_Gain1 * rtb_S1;
}
void ComputeY1()
{
    /* Outport: '<Root>/Out1' incorporates:
     * Gain1: '<Root>/Gain2' and Integrator
     */
    real_T rtb_S3;
    rtb_S3 = rtX.Integrator_CSTATE;
    rtY.Out1 = rtP.Gain2_Gain1 * rtb_S3;
}
void ComputeY2()
{
    ComputeYatBothMinorAndMajorTime()
    rtY.Out2 = rtB.Gain1;
}
/* ComputeY for root system: '<Root>' */
void ComputeY()
{
    ComputeY1(tid);
    ComputeY2(tid);
}
```

FIG. 9C

```
/* Derivatives for root system: '<Root>' */
void ComputeXdot(void)
{
    /* Minor output */
    ComputeYatBothMinorAndMajorTime()
    /* Derivatives for Integrator: '<Root>/Integrator' */
    ((StateDerivatives *) ssGetdX(rtS))->Integrator_CSTATE = rtB.Gain1;
}
```

FIG. 9D

GRAPH-BASED PARTITIONING OF DYNAMIC SYSTEM EXECUTION

BRIEF DESCRIPTION OF THE DRAWINGS

FIG. 5A-5D are diagrams of an example implementation relating to the example process shown in FIG. 4;

FIGS. 7A and 7B are flow charts of an example process for utilizing separate execution functions when executing a model;

FIGS. 9A-9D are diagrams of another example implementation relating to the example processes shown in FIGS. 7A and 7B.

DETAILED DESCRIPTION

The following detailed description of example implementations refers to the accompanying drawings. The same reference numbers in different drawings may identify the same or similar elements.

Computational tools may help users model, simulate, and/or analyze dynamic systems. Dynamic systems may be represented as graphical models. Graphical models may be represented as block diagrams that include connected individual blocks. Individual blocks in a model may represent a wide variety of model elements that perform functions, such as but not limited to, providing or calculating data associated with the dynamic system being modeled. For example, individual blocks may represent data sources, inputs, outputs, mathematical functions (e.g., a sine wave, an integrator, etc.), or the like.

Computational tools may determine a manner of executing (e.g., simulating) a model by analyzing the individual blocks. The computational tools may identify dependencies between individual blocks and determine the execution order of the blocks based on the identified dependencies. Systems and/or methods described herein may create separate execution functions that define block execution order based on dependencies between interconnected blocks in a model. For example, the separate execution functions may enable parallel execution of different portions of a model. Additionally, or alternatively, the separate execution functions may be used to apply multiple solvers to different portions of the model. In this way, execution of the model may be made more efficient.

Figure 1:
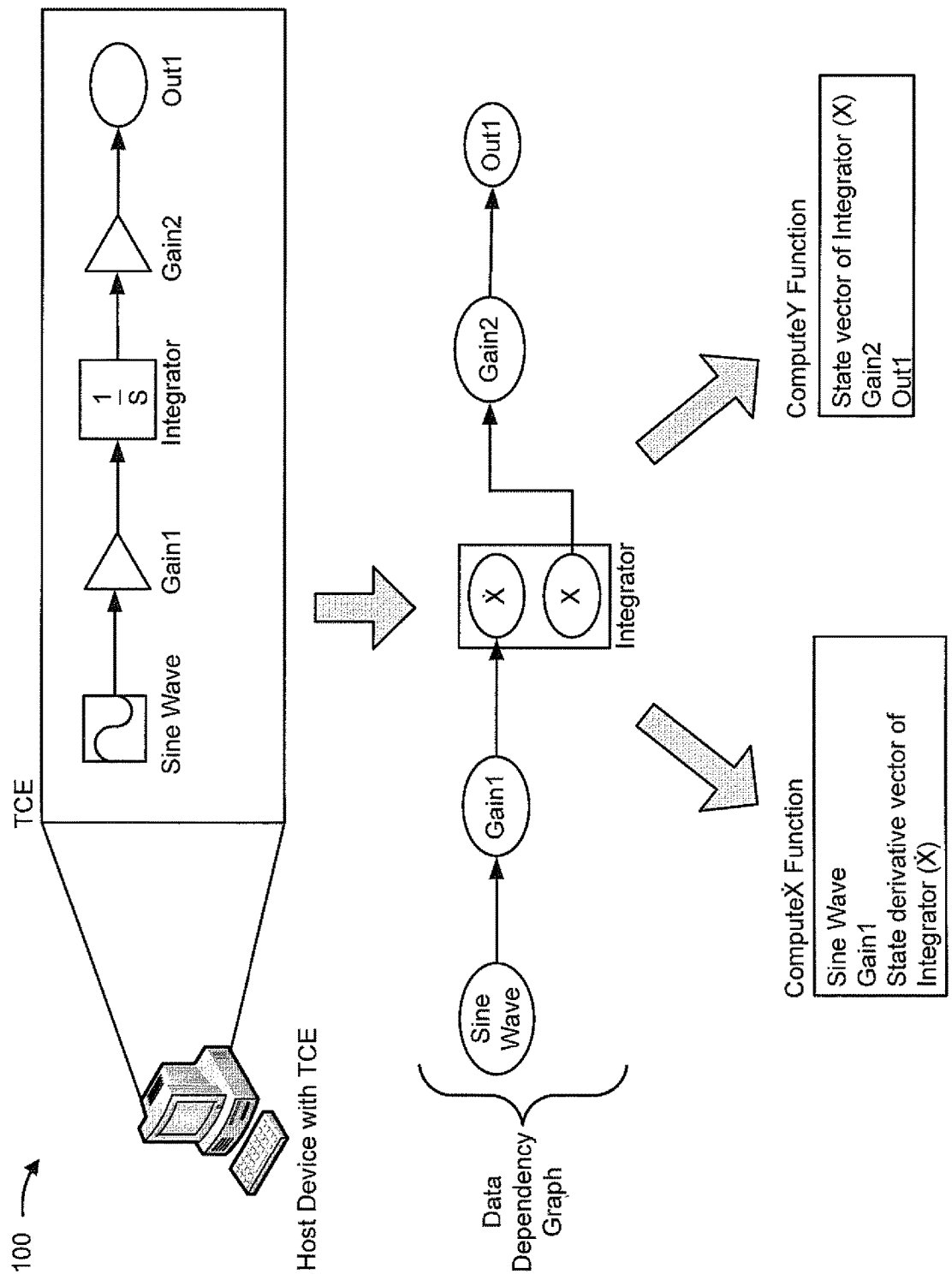
FIG. 1 is a diagram of an overview of an example implementation described herein.

FIG. 1 is a diagram of an overview of an example implementation 100 described herein. As shown in FIG. 1, example implementation 100 may include a host device including a computational tool, such as a technical computing environment (TCE). In FIG. 1, assume that a model representing a dynamic system is being manipulated in the TCE. The model includes a number of individual interconnected blocks, labeled as Sine Wave, Gain1, Integrator, Gain2, and Out1. Arrows between blocks may represent signals or values of data that are being transmitted from one block to another.

As further shown in FIG. 1, the TCE may determine a representation of the block diagram model suitable for determining data dependencies between individual interconnected blocks. For example, the TCE may generate a data dependency graph to determine the data dependencies between the interconnected blocks. The data dependency graph may be used to determine the dependencies for each block in the model (e.g., dependencies between variable represented by a block) and to determine the dependencies between blocks in the model. Individual block dependencies (e.g., variable dependencies) and dependencies between blocks in the model may be further used to calculate the system-level dependencies for the output of the entire model (e.g., Out1).

As further shown in FIG. 1, the TCE may generate multiple, different execution functions for a system-level output calculation and a system-level derivative calculation based on the data dependencies identified in the data dependency graph. The generated execution functions may enable the TCE to execute or simulate the model in a more efficient manner. For example, without determining the data dependencies for each block according to implementations described herein, an execution function for the model may include every block in the model. For example, the execution function may include the Sine Wave, Gain1, Integrator, Gain2, and Out1 blocks. Thus, whenever a calculation (e.g., a derivative calculation, an output calculation, etc.) is required for the model (e.g., at every time step during model execution), the host device executes every block in the model.

Implementations described herein utilize the data dependency between block equations to determine separate execution functions for the model, including a model-level function to compute the output execution function of each block in the model (e.g., ComputeY) and a model-level function to compute the derivative execution function of each block in the model (e.g., ComputeẊ). Functions may include methods, executable instructions, and/or portions of program code. For example, as shown in the data dependency graph of FIG. 1, Out1 is dependent on Gain2, which is further dependent on the state vector ("X") of the Integrator block. The output of the Sine Wave block, the Gain1 block, and the state derivative vector ("Ẋ") of the Integrator block do not contribute to the computation of Out1 during a simulation step. Using this data dependency information, the ComputeY function may identify the state vector of the Integrator block (e.g., shown as X), the Gain2 block output, and the Out1 block output, which are used in an output calculation. Similarly, the ComputeẊ function may identify the Sine Wave block, the Gain1 block, and the state derivative vector of the Integrator block (e.g., shown as Ẋ), which are used in a derivative calculation.

When executing the model, the host device may execute the blocks identified in the ComputeẊ function whenever a system-level derivative calculation is needed (e.g., at a minor time step during model execution), and may execute the blocks identified in the ComputeY function whenever a system-level output calculation of the model is needed (e.g., at a major time step during model execution). In this way, the host device may execute the model more efficiently than if every block is executed at every time step during model execution, which may be the case where a single execution function is used.

Figure 2:
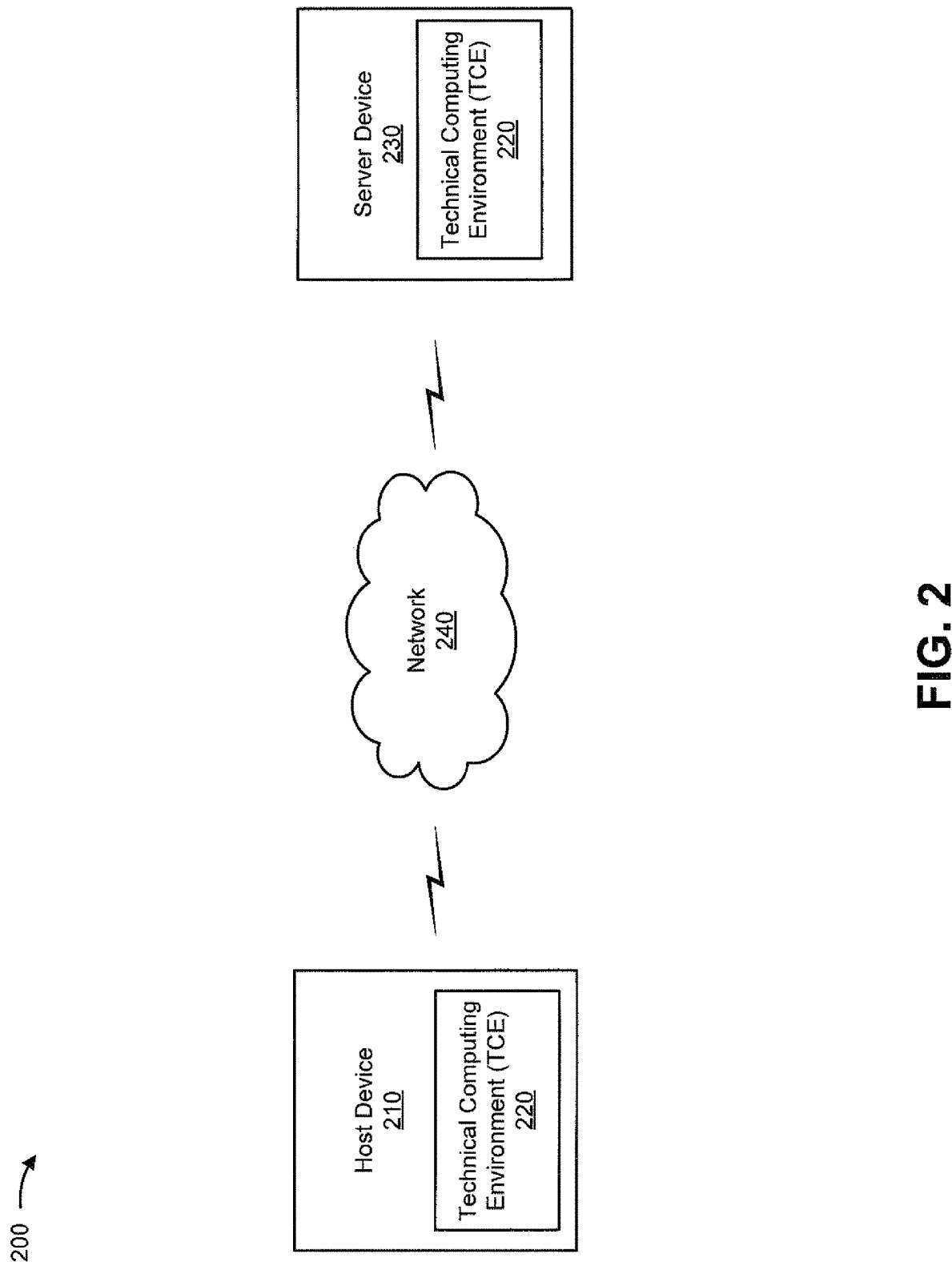
FIG. 2 is a diagram of an example environment in which system and/or methods described herein may be implemented.

FIG. 2 is a diagram of an example environment 200 in which systems and/or methods described herein may be implemented. As shown in FIG. 2, environment 200 may include a host device 210, which may include a TCE 220. Furthermore, environment 200 may include a server device 230, which may include TCE 220, and a network 240. Devices of environment 200 may interconnect via wired connections, wireless connections, or a combination of wired and wireless connections.

Host device 210 may include a device capable of receiving, generating, storing, processing, executing, and/or providing a model and/or information associated with a model (e.g., an executable model element, a block, an input signal, a portion of code, a data dependency list, an execution function, a list of execution functions etc.). For example, host device 210 may include a computing device (e.g., a desktop computer, a laptop computer, a tablet computer, a mobile device, etc.) or a similar device. In some implementations, host device 210 may receive information from and/or transmit information to server device 230 (e.g., information associated with a model).

Host device 210 may host TCE 220. TCE 220 may include a hardware-based component or a combination of hardware and software-based components that provides a computing environment that allows tasks to be performed (e.g., by users) related to disciplines, such as, but not limited to, mathematics, science, engineering, medicine, and business. TCE 220 may include a text-based environment (e.g., MATLAB® software), a graphically-based environment (e.g., Simulink® software, Stateflow® software, SimEvents® software, etc., by The MathWorks, Inc.; VisSim by Visual Solutions; LabView® by National Instruments; Agilent VEE by Agilent Technologies; Advanced Design System (ADS) by Agilent Technologies; Agilent Ptolemy by Agilent Technologies; etc.), or another type of environment, such as a hybrid environment that may include, for example, a text-based environment and a graphically-based environment. In some implementations, TCE 220 may include, for example, a user interface and/or may enable simulation and execution of hardware and/or software systems.

TCE 220 may be integrated with or operate in conjunction with a graphical modeling environment, which may provide graphical tools for constructing models of systems and/or processes. TCE 220 may include additional tools, such as tools designed to convert a model into an alternate representation, such as an alternate model format, source computer code and/or compiled computer code, a hardware description (e.g., a specification of a digital circuit, a description of a circuit layout, etc.), a directed graph, or the like. TCE 220 may include a tool to convert a model into project files for use in an integrated development environment (IDE) such as Eclipse by Eclipse Foundation, IntelliJ IDEA by JetBrains, or Visual Studio by Microsoft.

A model generated with TCE 220 may include, for example, equations, an action language, assignments, constraints, computations, algorithms, functions, methods, communication protocols, process flows, etc. The model may be implemented as, for example, a time-based block diagram (e.g., via the Simulink® product), a discrete-event based diagram (e.g., via the SimEvents® product), a dataflow diagram, a state transition diagram (e.g., via the Stateflow® product), a software diagram, a textual array-based and/or dynamically typed language (e.g., via the MATLAB® product), a non-causal block diagram (e.g., via the Simscape™ product), a causal block diagram, and/or another type of model or any combination of the above and/or other types of models.

The system represented by a model may have various execution semantics that may be represented in the model as a collection of model elements, often referred to as blocks. A model may include one or more executable model elements (e.g., blocks, program code portions that represent blocks, etc.) that simulate and/or implement characteristics of a dynamic system. A model element may implement, in the model, data specifications, processing functions, and/or input/output connections that are representative of a portion of the dynamic system being modeled, such as a component, a subsystem, etc. A model element and/or a block may generally refer to a portion of functionality that may be used in the model. The model element and/or block may be represented graphically, textually, and/or stored in some form of internal representation. Also, a particular visual depiction used to represent the model element, for example in a graphical block diagram, may be a design choice. A model element may be hierarchical in that, for example, a block may include one or more blocks that make up the block. A relationship between model elements may be represented by a line (e.g., a connector line) and/or a reference. Attributes of a model element may include value information and/or meta-information for the model element associated with the attribute.

A graphical model (e.g., a functional model) may include graphical entities with relationships between the graphical entities, and the relationships and/or the entities may have attributes associated with the relationships and/or entities. The graphical entities may represent time-based dynamic systems, such as differential equation systems. In some embodiments, the graphical model and the graphical entities may represent a multi-domain dynamic system. The domains may include execution domains such as, for example, continuous time, discrete time, discrete event, state transition system, and/or a model of computation. The computation of the model may be based on differential equations (e.g., ordinary differential equations), difference equations, algebraic equations (e.g., differential algebraic equations), implicit equations, discrete events, discrete states, stochastic relations, data flows, synchronous data flows, control flows, process networks, state machines, mass matrices, etc.

A graphical model may represent a hierarchical system. The hierarchical system represented by the graphical model may contain virtual subsystems and non-virtual subsystems. In the context of model execution, a virtual subsystem may represent a flat organization of subsystems without hierarchical dependencies. In the context of model execution, a non-virtual subsystem may represent a hierarchical organization of subsystems. Each subsystem may possess one or more execution functions representing the dependencies of the model subsystem. The execution functions of a subsystem may be arranged in one or more lists.

A graphical model may include configuration information. The configuration information may include information such as model execution information (e.g., numerical integration schemes, fundamental execution period, etc.). Model execution information may further include information specifying single tasking, multi-tasking or concurrent execution methods. Configuration information may also include model diagnostic information (e.g., whether an algebraic loop should be considered an error or result in a warning), model optimization information (e.g., whether model elements should share memory during execution), model processing information (e.g., whether common functionality should be shared in code that is generated for a model), etc.

An executable graphical model may include a time-based block diagram. A time-based block diagram may include, for example, blocks connected by lines (e.g., connector lines). The blocks may include elemental dynamic systems, such as a differential equation system (e.g., to specify continuous-time behavior), a difference equation system (e.g., to specify discrete-time behavior), an algebraic equation system (e.g., to specify constraints), a state transition system (e.g., to specify finite state machine behavior), an event based system (e.g., to specify discrete event behavior), etc. The lines may represent signals (e.g., to specify input/output relations between blocks or to specify execution or data dependencies between blocks), variables (e.g., to specify information shared between blocks), physical connections (e.g., to specify electrical wires, pipes with volume flow, rigid mechanical connections, etc.), etc. The attributes may consist of meta-information, such as sample times, dimensions, complexity (e.g., whether there is an imaginary component to a value), data type, etc. associated with the model elements.

In a time based block diagram, ports may be associated with blocks. A relationship between two ports may be created by connecting a line (e.g., a connector line) between the two ports. A relationship between blocks may be causal and/or non-causal. For example, a model (e.g., a functional model) may include a block that represents a continuous-time integration block that may be causally related to a data logging block by using a line (e.g., a connector line) to connect an output port of the continuous-time integration block to an input port of the data logging block. Further, during execution of the model, the value stored by the continuous-time integrator may change as the current time of the execution progresses. The value of the state of the continuous-time integrator may be available on the output port and the connection with the input port of the data logging block may make this value available to the data logging block.

In some implementations, a block may include or otherwise correspond to a non-causal modeling function or operation. An example of a non-causal modeling function may include a function, operation, or equation that may be executed in different fashions depending on one or more inputs, circumstances, and/or conditions. Put another way, a non-causal modeling function or operation may include a function, operation, or equation that does not have a predetermined causality. For instance, a non-causal modeling function may include an equation (e.g., X=2Y) that can be used to identify the value of one variable in the equation (e.g., "X") upon receiving an assigned value corresponding to the other variable (e.g., "Y"). Similarly, if the value of the other variable (e.g., "Y") were provided, the equation could also be used to determine the value of the one variable (e.g., "X").

Server device 230 may include one or more devices capable of receiving, generating, storing, processing, executing, and/or providing a model and/or information associated with a model (e.g., information associated with a model element). For example, server device 230 may include a computing device, such as a server, a desktop computer, a laptop computer, a tablet computer, a mobile device (e.g., a smart phone), or a similar device. In some implementations, server device 230 may host TCE 220.

Network 240 may include one or more wired and/or wireless networks. For example, network 240 may include a cellular network, a public land mobile network (PLMN), a local area network (LAN), a wide area network (WAN), a metropolitan area network (MAN), a telephone network (e.g., the Public Switched Telephone Network (PSTN)), a Bluetooth network, an ad hoc network, an intranet, the Internet, a fiber optic-based network, and/or a combination of these or other types of networks.

The number of devices and networks shown in FIG. 2 is provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, one or more of the devices of environment 200 may perform one or more functions described as being performed by another one or more devices of environment 200.

Figure 3:
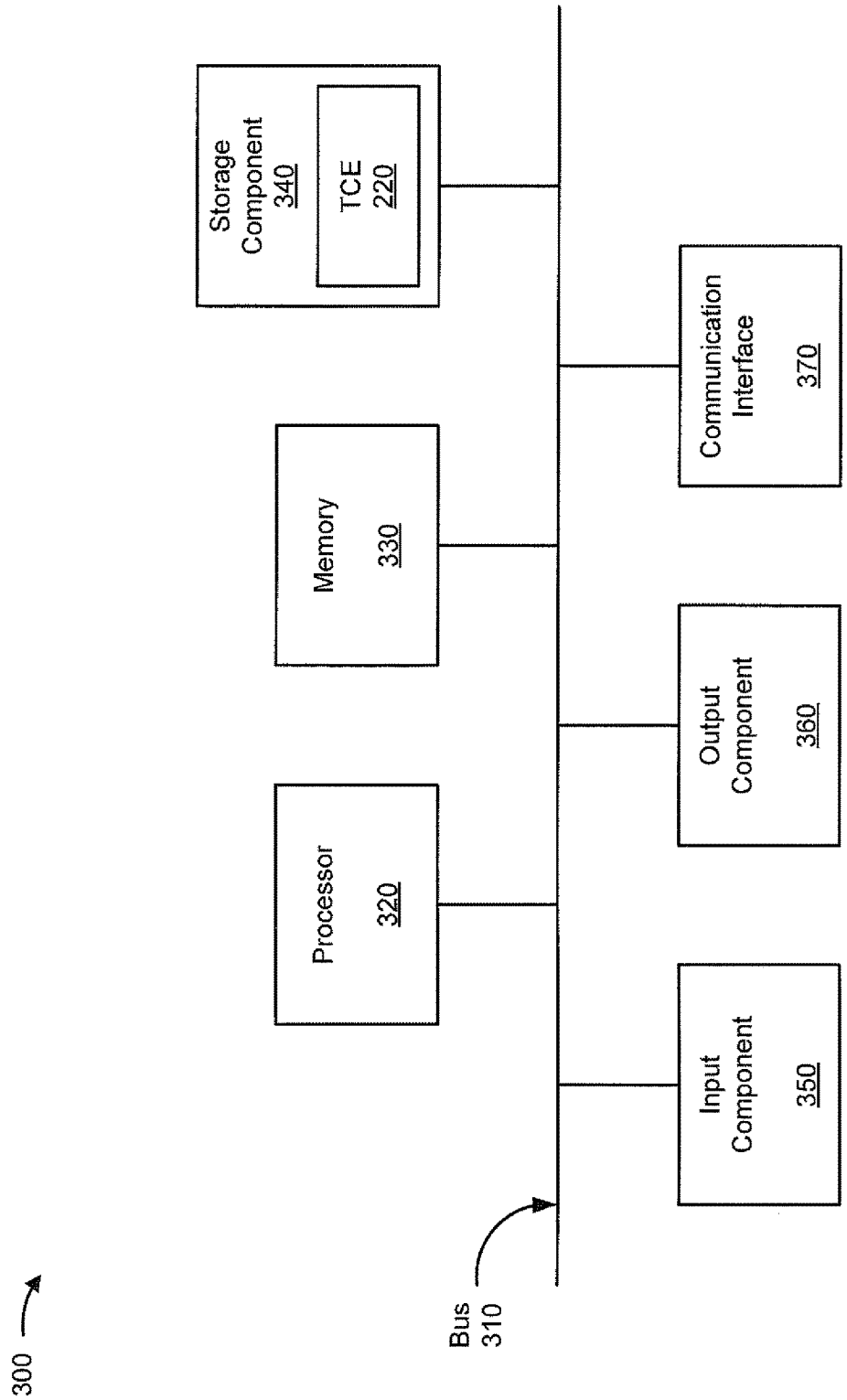
FIG. 3 is a diagram of example components of one or more devices of FIG. 2.

FIG. 3 is a diagram of example components of a device 300, which may correspond to host device 210 and/or server device 230. In some implementations, host device 210 and/or server device 230 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 may include a component that permits communication among the components of device 300. Processor 320 may include a processing unit (e.g., a central processing unit (CPU), a graphics processing unit (GPU), an accelerated processing unit (APU), etc.), a microprocessor, and/or any processing component (e.g., a programmable logic unit or device, a field-programmable gate array (FPGA), an application-specific integrated circuit (ASIC), etc.) that interprets and/or executes instructions. Device 300 may include one or more processors 320 (e.g., may include multiple processors 320 that operate in series or in parallel). Memory 330 may include a random access memory (RAM), a read only memory (ROM), and/or another type of dynamic or static storage component (e.g., a flash, magnetic, or optical memory) that stores information and/or instructions for use by processor 320.

Storage component 340 may store information and/or software, in a machine/computer-readable format, related to the operation and use of device 300. For example, storage component 340 may include a hard disk (e.g., a magnetic disk, an optical disk, a magneto-optic disk, a solid state disk, etc.), a compact disk (CD), a digital versatile disk (DVD), a floppy disk, a cartridge, a memory card, a magnetic tape, and/or another type of computer-readable medium, along with a corresponding drive. In some implementations, storage component 340 may store TCE 220.

Input component 350 may include a component that permits a user to input information to device 300 (e.g., a touch screen display, a keyboard, a keypad, a mouse, a button, a switch, etc.). Output component 360 may include a component that outputs information from device 300 (e.g., a display, a speaker, one or more light-emitting diodes (LEDs), etc.).

Communication interface 370 may include a transceiver-like component, such as a transceiver and/or a separate receiver and transmitter that enables device 300 to communicate with other devices, such as via a wired connection, a wireless connection, or a combination of wired and wireless connections. For example, communication interface 370 may include an Ethernet interface, an optical interface, a coaxial interface, a wireless network interface controller, an infrared interface, a radio frequency (RF) interface, a universal serial bus (USB) interface, or the like.

Device 300 may perform one or more processes described herein. Device 300 may perform these processes in response to processor 320 executing software instructions included in a computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number of components shown in FIG. 3 is provided as an example. In practice, device 300 may include additional components, fewer components, different components, or differently arranged components than those shown in FIG. 3. Additionally, or alternatively, one or more components of device 300 may perform one or more functions described as being performed by another one or more components of device 300.

Figure 4:
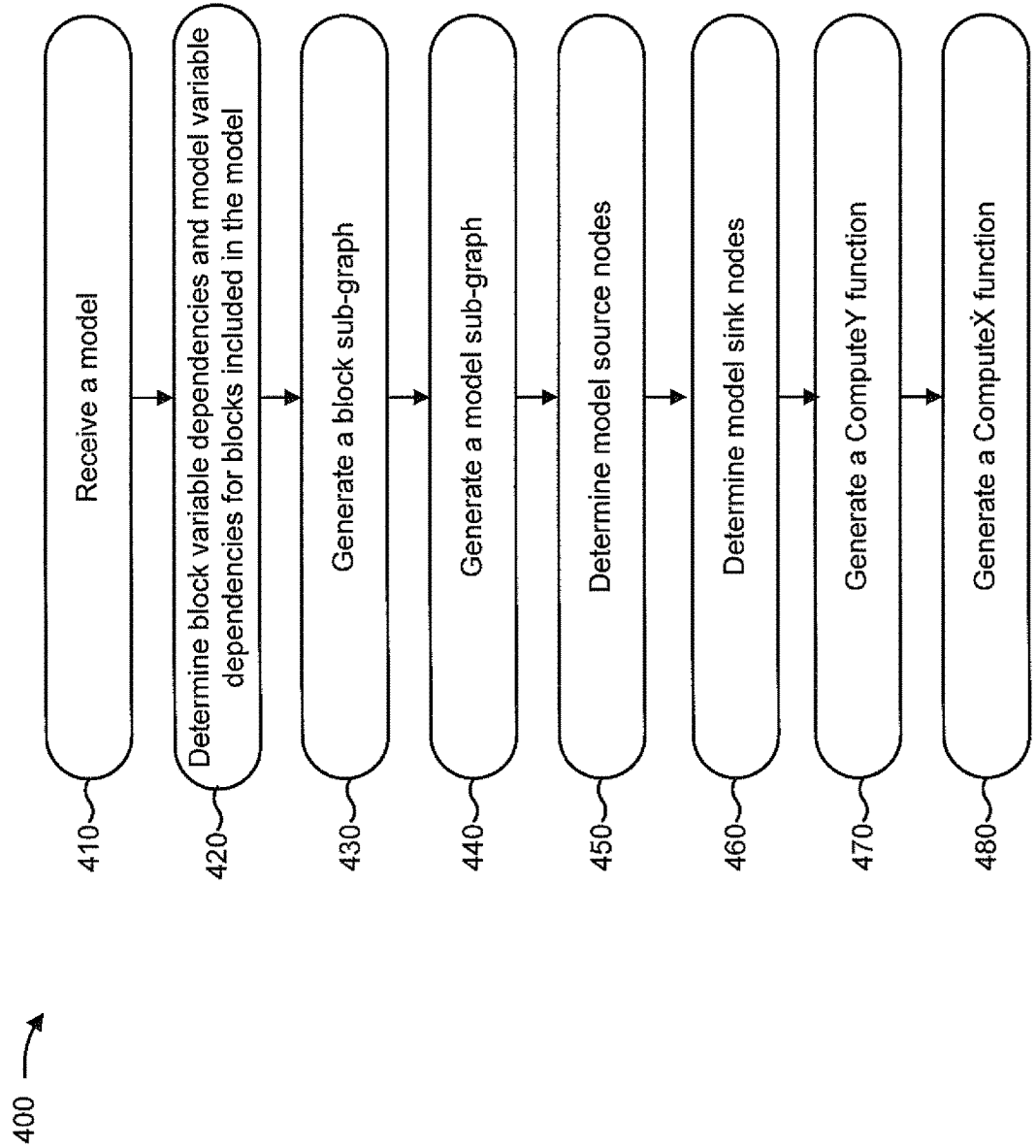
FIG. 4 is a flow chart of an example process for creating separate execution functions that define block execution order based on dependencies between interconnected blocks in a model.

FIG. 4 is a flow chart of an example process 400 for creating separate execution functions that define block execution order based on dependencies between interconnected blocks in a model. In some implementations, one or more process blocks of FIG. 4 may be performed by host device 210. In some implementations, one or more process blocks of FIG. 4 may be performed by another device or a group of devices separate from or including host device 210, such as server device 230.

As shown in FIG. 4, process 400 may include receiving a model (block 410). For example, host device 210 (e.g., TCE 220) may receive a request, from a user of host device 210, to access a model. The request may include information identifying the model, such as a name of the model and/or information identifying a memory location at which the model is stored. The memory location may be located within host device 210 or external to, and possibly remote from, host device 210 (e.g., within server device 230 or another device on network 240). Host device 210 may, based on receiving the request, retrieve the model from the memory location. In some implementations, host device 210 may provide, for display, a user interface that depicts all or a portion of the model.

As further shown in FIG. 4, process 400 may include determining block variable dependencies and model variable dependencies for blocks included in the model (block 420). For example, host device 210 may determine the block variable dependencies by determining one or more Jacobian patterns for one or more corresponding blocks in the model. Additionally, or alternatively, a Jacobian pattern of a block may be determined based on retrieving a user pre-defined pattern for the block. A block may represent a model element in a graphical modeling environment, a textual modeling environment, and/or a hybrid modeling environment. For example, a block may include a graphical block in a graphical modeling environment. Additionally, or alternatively, a block may include a block of program code in a textual modeling environment. In some implementations, a block may include a combination of different model elements, such as a graphical block and a block of program code.

The Jacobian pattern of a block may be determined by analyzing the equations representing a block and the corresponding Jacobian matrix. For example, a block in a model may be represented by the equations:

$$\begin{cases} \dot{x} = f(x(t), u(t)) \\ y = g(x(t), u(t)) \end{cases} \quad (1)$$

These equations may also be known as a set of dynamic equations (e.g., that are a function of time). The equations in (1) may be based on state x of the block and input u of the block. Time-derivative, or derivative, $\dot{x}$ of the block may be determined by function $f$, which may operate on state x and input u. Output y of the block may be determined by function g, which may operate on state x and input u. State vector x, derivative of the state vector $\dot{x}$, input vector u, and output vector y may be referred to as variables of the block. Each vector may include one or more values. Thus, a derivative $\dot{x}$ associated with the block may be calculated by performing a first function on one or more values of state x (e.g., at time t) and/or one or more values of input u (e.g., at time t). An output y associated with the block may be calculated by performing a second function on one or more values of state x (e.g., at time t) and/or one or more values of input u (e.g., at time t).

In a continuous-time model block, the equation for $\dot{x}$ may be referred to as a derivative function, and the equation for y may be referred to as an output function. For a discrete-time model block, the derivative function may be replaced by an update function and the time derivative variable may be replaced by a time delay variable. For simplicity, continuous-time systems are described herein, but techniques described herein may be applied to discrete-time systems, discrete-event systems, and hybrid systems (e.g., that include both continuous and discrete states).

Similar to the equation in (1), a zero-crossing function may be defined as:

$$z = g(x(t), u(t)). \quad (2)$$

A dependency graph describing the dependencies of variables z and x, as well as z and u, may be determined by calculating the Jacobian pattern associated with the zero-crossing function and the corresponding Jacobian matrix. The dependency information associated with the zero-crossing function may also be available from user-defined input to show the dependency between z and x, as well as z and u. For example, a user may specify the dependency between variables in a zero-crossing function using a flag or programming construct such as "zNeedu" or "zNeedx".

A Jacobian matrix for the block may be defined as a matrix of partial derivatives of the function $f$ with respect to state x and input u, and the function g with respect to state x and input u. For example, a Jacobian matrix J may be expressed as:

$$J = \begin{bmatrix} \dfrac{\partial f}{\partial x} & \dfrac{\partial f}{\partial u} \\ \dfrac{\partial g}{\partial x} & \dfrac{\partial g}{\partial u} \end{bmatrix} = \begin{bmatrix} A & B \\ C & D \end{bmatrix} \quad (3)$$

As can be seen in equation (3), the Jacobian matrix J may include Jacobian block matrices A, B, C, and D. Jacobian block matrix A may be determined from the partial derivative of function $f$ with respect to state x. Jacobian block matrix B may be determined from the partial derivative of function $f$ with respect to input u. Jacobian block matrix C may be determined from the partial derivative of function g with respect to state x. Jacobian block matrix D may be determined from the partial derivative of function g with respect to input u.

A Jacobian matrix may include a time varying matrix, as the values of elements of the Jacobian matrix may change over time. However, for some functions, some of the elements in a Jacobian matrix may always be zero. For example, consider the following functions:

$$\begin{cases} \dot{x}_1 = x_2^2 \\ \dot{x}_2 = x_1 + x_2 \end{cases} \quad (4)$$

The Jacobian block matrix A represents how $\dot{x}_1$ and $\dot{x}_2$ depend on $x_1$ and $x_2$. For function (4) above, the A matrix is:

$$A = \begin{bmatrix} A_{11} & A_{12} \\ A_{21} & A_{22} \end{bmatrix} = \begin{bmatrix} 0 & 2x_2 \\ 1 & 1 \end{bmatrix}. \quad (5)$$

$A_{11}$ corresponds to the effect of $x_1$ on $\dot{x}_1$. $A_{12}$ corresponds to the effect of $x_2$ on $\dot{x}_2$. $A_{21}$ and $A_{22}$ correspond to the effect of $x_1$ and $x_2$ on $\dot{x}_2$ respectively.

In this example, $A_{11}$, the upper left element in the matrix, may always be zero. Such elements that are always zero may be called "hard zeroes." As further shown in this example, $A_{12}$, the upper right element in the matrix, is equal to $2x_2$. Accordingly, $A_{12}$ could be zero if $x_2$ is zero. Elements that may sometimes be zero may be called "soft zeroes."

From a Jacobian matrix, a corresponding pattern matrix may be constructed, for example, by replacing any non-hard zero elements in the Jacobian matrix by a one. The pattern matrix may reflect the structure or data dependency in a block or system of equations. Users may find that the use of pattern equations allows them to visualize aspects of structures and/or data dependencies within a block/system. A constructed pattern matrix may be called a Jacobian pattern matrix or a sparsity pattern matrix. For a Jacobian block matrix, the pattern matrix may also be referred to as a Jacobian block pattern. For the above example, the block Jacobian pattern $A_p$ of the Jacobian block matrix A may be:

$$A_p = \begin{bmatrix} 0 & 1 \\ 1 & 1 \end{bmatrix}. \quad (6)$$

For example, $A_{p,11}=0$ means that in the above equation, $x_1$ is not needed for the computation of $\dot{x}_1$. In other words, $\dot{x}_1$ is not dependent on $x_1$. $A_{p,12}=1$ means that $\dot{x}_1$ depends on $x_2$. As can be seen in the function for $\dot{x}_1$, $\dot{x}_1$ is calculated based on $x_2$. If $\dot{x}_1$ is based on $x_2$, $\dot{x}_1$ may also be referred to as reachable from $x_2$.

Jacobian block patterns may be pre-defined, in some implementations. In the case where the block Jacobian pattern is pre-defined, the pattern may be defined by an author of a block of the model. For example, the author may specify a Boolean-valued pattern matrix, an edge list, an incident list, etc., from which the pattern may be inferred. The specification may be in graphical and/or textual form. The specification may then be retrievable when needed. A block may be defined by the following functions:

$$\begin{cases} \dot{x} = f(x, u, t) \\ y = g(x, u, t) \end{cases} \quad (7)$$

The data dependency of the above equations may be defined based on Boolean values, such as:

$$\begin{cases} \dot{x} \leftarrow A_p x + B_p u \\ y \leftarrow C_p x + D_p u \end{cases} \quad (8)$$

where '+' may be evaluated as 'or'. As further shown in equation 8, '←' (the left arrow) may be interpreted as a data dependence between the variables. For example, equation 7 may be evaluated as the value of '$\dot{x}$' depends on the value of '$A_p x + B_p u$'.

Given $A_{p,mn}$, where m represents a row and n represents a column in the Jacobian pattern $A_p$, $A_{p,mn}=1$ may mean that $\dot{x}_m$ depends on $x_n$, meaning that $x_n$ appears in the right hand side of the equation to compute $\dot{x}_m$. In other words, $\dot{x}_m$ can be reached from $x_n$.

Similarly, $B_{p,mn}=1$ may mean that $\dot{x}_m$ depends on $u_n$, meaning that $u_n$ appears in the right-hand side of the equation to compute $\dot{x}_m$. Correspondingly, $C_{p,mn}=1$ may mean that $y_{in}$ depends on $x_n$, meaning that $x_n$ appears in the right hand side of the equation to compute $y_m$. Likewise, $D_{p,mn}=1$ may mean that $y_m$ depends on $u_n$, meaning that $u_n$ appears in the right hand side of the equation to compute $y_m$.

Additionally, or alternatively, techniques described herein may apply to a system of equations represented by one or more differential algebraic equations. A differential algebraic equation may include one or more implicit equations and/or may be represented using a mass matrix.

As further shown in FIG. 4, process 400 may include generating a block sub-graph (block 430). For example, host device 210 may utilize the Jacobian block pattern to determine the block variable dependencies and generate a semantic representation of the block variable dependencies, such as a block sub-graph. In some implementations, Jacobian block patterns may be determined based on semantic representations. An example of a semantic representation may include a sub-graph, a control flow graph, a data flow graph, or the like.

In some implementations, a sub-graph may include a cyclic graph. Additionally, or alternatively, a sub-graph may include a directed acyclic graph. Nodes in a directed acyclic graph may represent blocks in a model containing differential algebraic equations. A control flow graph (CFG) may include a representation (e.g., using graph notation) of all paths that may be traversed through a block during execution of the block. A semantic representation may include a data flow graph, in some implementations. A data flow graph (DFG) may include a representation (e.g., using graph notation) of all paths along which data can be communicated between blocks during an execution of the blocks that the DFG represents. In some implementations, a semantic representation may include a combination of control flow and data flow graphs, or a net list (e.g., a list of entities and/or computations and connections between these entities). In some implementations, the various semantic representations may be in-memory representations only (e.g., an intermediate representation).

As further shown in FIG. 4, process 400 may include generating a model sub-graph (block 440). For example, host device 210 may utilize the Jacobian block pattern for all blocks in a model to determine the model variable dependencies and generate a semantic representation of the model sub-graph. In some implementations, the individual block sub-graphs of the model may be connected together to generate a model sub-graph. For example, by connecting the block sub-graphs, the connection between an output of one block and an input of another block can be analyzed for dependencies.

In some implementations, when modeling a system containing differential algebraic equations, the model and generated model sub-graph may include an algebraic loop. For example, a cyclic graph sub-graph may be generated that includes an algebraic loop. A cyclic graph sub-graph may be converted to a directed acyclic graph sub-graph by identifying all nodes in the loop and by identifying nodes connecting the loop sub-graph to the model sub-graph. In some implementations, an interface node may be inserted into the model sub-graph to represent the nodes of the algebraic loop and encapsulate the input and output functions of the algebraic loop. For example, the interface nodes may be used to represent the data dependencies between the input node and the output node of the algebraic loop. Interface nodes may also represent an output function of the model sub-graph.

When the blocks of the model are represented in a model sub-graph, TCE 220 may determine the model source nodes (e.g., X and U) and the model sink nodes (e.g., X and Y).

Model source nodes and model sink nodes may be related via a set of dynamic equations, as follows:

$$\begin{cases} \dot{X} = F(X, U) \\ Y = G(X, U) \end{cases}.$$

Model source nodes and model sink nodes may also be variables in the model that are designated as data sources and data sinks for dependency analysis.

Vector X may represent a state vector of the entire model, and vector $\dot{X}$ may represent a derivative of state vector X. Model input vector U and model output vector Y may represent the root input and output vectors of the model, respectively, and may represent the boundaries of the model (e.g., the inputs being provided to drive the model and the outputs being measured and/or monitored from the model as a whole). Derivative vector $\dot{X}$ may be determined based on function F (e.g., a model derivative function), which may operate on model state vector X and/or model input vector U (e.g., at time t). Model output vector Y may be determined based on function G (e.g., a model output function), which may operate on model state vector X and/or model input vector U (e.g., at time t).

As further shown in FIG. 4, process 400 may include determining model source nodes (block 450). For example, host device 210 may analyze the generated model sub-graph to determine source nodes (e.g., X and U). In some implementations, host device 210 may identify a set of blocks in the model that contain states represented by vectors X and $\dot{X}$ (e.g., an integrator block, a state space block, etc.), and may identify a set of blocks that are inputs to the model (e.g., root-level inputs, represented by vector U). The vectors X and U (and/or blocks that include these vectors) may be identified as source nodes.

A block containing state may output the value of the integral of the block's input signal with respect to time. The output of a block containing state at a particular time step may be computed by a solver using the input value and the value of the state at the previous time step. A block containing state may save an output at the current time step for use by the solver to compute the block's output at the next time step. A block containing state may include an initial condition for use in computing the block's initial state. The default value of the initial condition may be set to zero. A block containing state may be used to calculate the block output over a range of time and input values.

As further shown in FIG. 4, process 400 may include determining model sink nodes (block 460). For example, host device 210 may analyze the generated model sub-graph to determine model sink nodes (e.g., $\dot{X}$ and Y). In some implementations, host device 210 may identify a set of blocks that are outputs of the model (e.g., root-level outputs, represented by vector Y) and may identify a set of blocks that contain states represented by vectors X and $\dot{X}$. The vectors $\dot{X}$ and Y (and/or blocks that include these vectors) may be identified as model sink nodes.

In some implementations, host device 210 may segment a block that contains state into an output portion (e.g., a portion used to compute y) and a derivative portion (e.g., a portion used to compute A block that contains state may include a y portion that represents one or more equations for determining an output of the block, and may include an $\dot{x}$ portion that represents one or more equations for calculating a derivative associated with the block. The value(s) of x may be used to calculate the value(s) of y and/or $\dot{x}$, in some implementations.

As further shown in FIG. 4, process 400 may include generating a ComputeY function (block 470). For example, host device 210 may generate the ComputeY function by analyzing each output block ($y_i$) in the set of all output blocks (y) in the model (e.g., in the model sub-graph) to determine blocks that drive the model level output (Y). For example, host device 210 may determine a backward path (e.g., a set of blocks connected via input and output ports) from an output block (e.g., a block $y_i$ in y) to a block containing state ($x_i$) and/or a block that is a root-level input ($u_i$). Host device 210 may include information identifying the blocks, included in this backward path, as part of the ComputeY function.

For example, host device 210 may generate a ComputeY function that identifies blocks that are determined to contribute data dependencies to the model level output (Y). Host device 210 may back-search the model sub-graph of node interconnections from the node representing the model level output (Y) to determine the nodes that contribute data dependencies. For example, starting at the node representing the model level output (Y), host device 210 may determine the nodes that connect to the input port of the node representing the model level output (Y). The output port of another node may connect to the input port of the model level output node. If the node connected to the input port of the model level output node is not a root-level input node (U) or a model state vector node (X), host device 210 may continue to back-search, and the node may be included in the ComputeY function (e.g. a first execution list) to represent the dependency between the node and the model level output node.

Additionally, or alternatively, host device 210, may generate one or more ComputeY functions that identify blocks that are determined to contribute data dependencies to the model level output (Y). For example, starting at the node representing the model level output (Y), host device 210 may determine that the node connected to the input port of the node representing the model level output (Y) has one or more elements. If the node connected to the input port of the model level output node is not a root-level input node (U) or a model state vector node (X), host device 210 may continue to back-search and the one or more elements may be included in one or more ComputeY functions (e.g., a first execution list) to represent the dependency between the elements and the model level output node.

In some implementations, host device 210 may add information identifying the block to the beginning of the ComputeY function, indicating that the added block is to be executed prior to other blocks already identified in the ComputeY function. Host device 210 may continue back-searching the model sub-graph and block dependencies until all blocks contributing a dependency to the model level output block (Y) have been identified. The back-searching may end at a model source block (e.g., a root-level input block (U) or model state vector block (X)). The root-level input block or model state vector block may be identified in the ComputeY function. Host device 210 may store the ComputeY function in memory to be used when the model is executed.

As further shown in FIG. 4, process 400 may include generating a ComputeẊ function (block 480). For example, host device 210 may generate the ComputeẊ function by analyzing each block containing state ($x_i$) in the set of all blocks in the model that contain state (x) to find all blocks necessary to compute the derivative W. For example, host device 210 may determine a backward path (e.g., a set of nodes connected via input and output ports) from a node containing states (e.g., a node $x_i$ in x) to another node containing state ($x_i$) and/or a node that is a root-level input ($u_i$). Host device 210 may include information identifying the nodes, included in this backward path, as part of the ComputeẊ function.

For example, host device 210 may generate a ComputeẊ function that identifies blocks that are determined to contribute data dependencies to the model level state derivative vector (Ẋ). Host device 210 may back-search the model sub-graph of block interconnections from the block representing the model level state derivative vector (Ẋ) to determine the blocks that contribute data dependencies. For example, starting at the block representing the model level state derivative vector (Ẋ), host device 210 may determine the blocks that connect to the input port of the block representing the model level state derivative vector (Ẋ). The output port of another block may connect to the input port of the model level state derivative vector block. If the block connected to the input port of the model level state derivative vector block is not a root-level input block (U) or model state vector block (X), then host device 210 may add information identifying the block to the ComputeẊ function (e.g., a second execution list) and continue to back-search.

Additionally, or alternatively, host device 210, may generate one or more ComputeẊ functions that identify blocks that are determined to contribute data dependencies to the model level state derivative vector (Ẋ). For example, starting at the node representing the model level state derivative vector (Ẋ), host device 210 may determine that the node connected to the input port of the node representing the model level state derivative vector (Ẋ), has one or more elements. If the node connected to the input port of the model level output node is not a root-level input node (U) or a model state vector node (X), host device 210 may continue to back-search and the one or more elements may be identified in one or more ComputeẊ functions (e.g., a second execution list) to represent the dependency between the elements and the model level state derivative vector node.

In some implementations, host device 210 may add information identifying the block to the beginning of the ComputeẊ function. The information may indicate that the added block is to be executed prior to other blocks already identified in the ComputeẊ function. Host device 210 may continue back-searching the model sub-graph and block dependencies until all nodes contributing a dependency to the model level state derivative vector node (Ẋ) have been identified. The back-searching may end at a model source node (e.g., a root-level input node (U) or model state vector node (X)). The root-level input node or model state vector node may be included in the ComputeẊ function. Host device 210 may store the ComputeẊ function in memory to be used when the model is executed.

In some implementations, a first set of blocks identified in the ComputeY function may be different from a second set of blocks identified in the ComputeẊ function. In some implementations, the first set of blocks and the second set of blocks may be mutually exclusive, meaning that the first set and the second set do not share any blocks. Alternatively, the first set of blocks and the second set of blocks may share one or more blocks, meaning that the one or more blocks may be identified in both the ComputeY function and the ComputeẊ function.

Although FIG. 4 shows example blocks of process 400, in some implementations, process 400 may include additional blocks, different blocks, fewer blocks, or differently arranged blocks than those depicted in FIG. 4. Additionally, or alternatively, two or more of the blocks of process 400 may be performed in parallel.

Figure 5A:
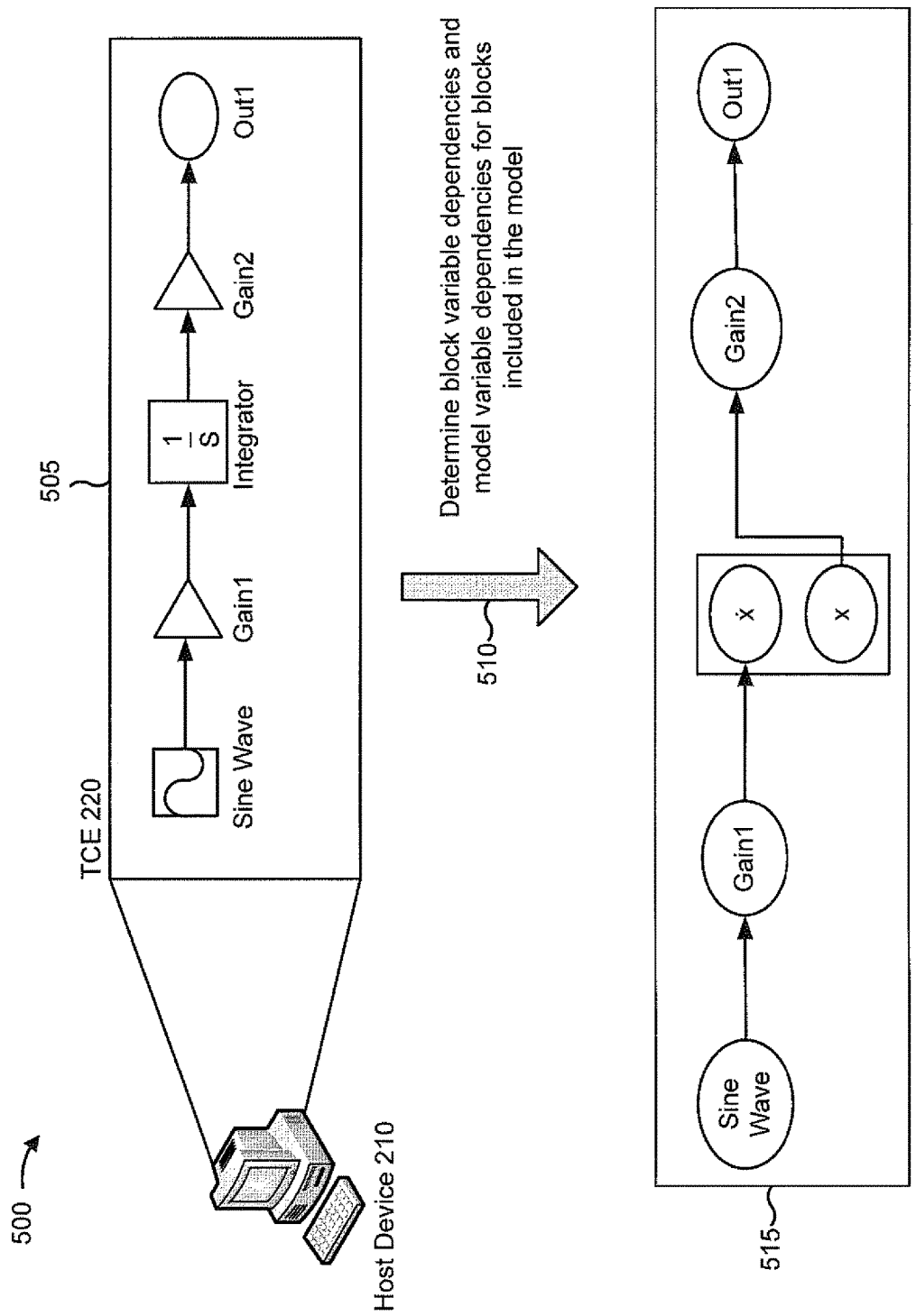

FIGS. 5A-5D are diagrams of an example implementation 500 relating to example process 400 shown in FIG. 4. As shown in FIG. 5A, assume that host device 210 receives a model. As shown by reference number 505, the model contains five interconnected blocks, shown as a Sine Wave block, a Gain1 block, an Integrator block, a Gain2 block, and an Out1 block. The Sine Wave block provides initial input to the model, and passes data to the Gain1 block. The Gain1 block receives an input of data from the Sine Wave block, processes the data, and provides an output of data to the Integrator block. The Integrator block receives the data from the Gain1 block, processes the data, and provides an output of data to the Gain2 block. The Gain2 block receives the input of data from the Integrator block and provides an output of data to the Out1 block.

As shown by reference number 510, host device 210 may determine the block variable dependencies and the model variable dependencies for each block included in the model. For example, host device 210 may utilize Jacobian block pattern information associated with each block in the model to determine the dependencies of each block and the model variable dependencies in the model. For example, as shown by reference number 515, host device 210 may utilize the Jacobian block pattern information associated with each block to represent the model and block dependencies. In this example, as shown in reference number 515, the Integrator block may include a state x and a derivative of state x, shown as ẋ.

Figure 5B:
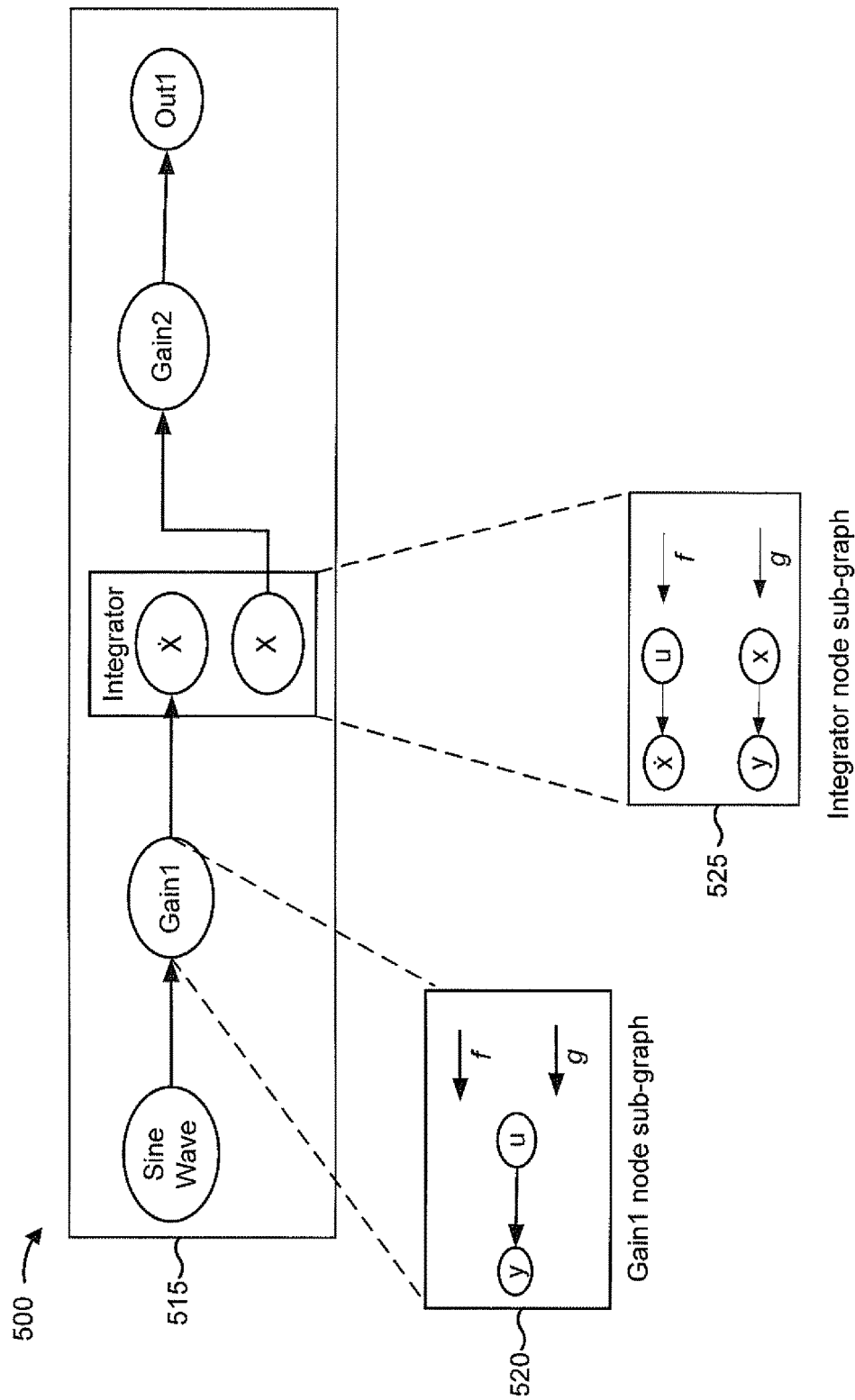

As shown in FIG. 5B, host device 210 may generate a node sub-graph for each block in the model. For example, as shown by reference number 520, host device 210 may generate the node sub-graph for the Gain1 block. In this example, as shown by reference number 520, the Gain1 node sub-graph indicates a dependency between the input vector, u, and the output vector, y. The Gain1 node sub-graph indicates that the node output vector, y, is dependent on input vector, u.

As further shown in FIG. 5B, and by reference number 525, host device 210 may generate the node sub-graph for the Integrator block. The Integrator block is a node that includes a state vector, X, and a derivative of the state vector, $\dot{X}$. The node sub-graph for the Integrator block indicates two unique dependencies. As shown by reference number 525, the derivative of state vector, $\dot{X}$ is dependent on the input vector, u. As further shown by reference number 525, the output vector, y, is dependent on the state vector, X. These dependencies are further reflected in the Integrator block, as shown by reference number 515. The state vector, X, and the derivative of state vector, $\dot{X}$ are separate variables used to calculate the overall execution of the Integrator block. Assume that host device 210 also determines the node sub-graphs for the other blocks in the model (e.g., Sine Wave, Gain2, and Out1).

As shown in FIG. 5C, and by reference number 530, host device 210 may generate a model sub-graph of the model. As shown by reference number 535, the model sub-graph may indicate the input vector, u, and the output vector, y, for each block in the model. For example, host device 210 may generate the model sub-graph of the model which identifies each input vector, u, and output vector, y, of every block in the model. As shown by reference number 535, the model sub-graph may be used to determine the model source nodes (e.g., the model input vector, U, and the model state vector, X) and to determine the model sink nodes (e.g., the model output vector, Y, and the model derivative of state vector, $\dot{X}$). For example, as shown by reference number 535, the model input vector, U, is identified as the Sine Wave node and the model output vector, Y, is identified as the Out1 node.

As further shown in FIG. 5C, host device 210 may generate a ComputeY function based on the model sub-graph. For example, as shown by reference number 540, host device 210 may back-search the model sub-graph from the model output vector Y, (e.g., the Out1 node), through the nodes that Y depends on, to identify the source node associated with the model output vector. Searching backward from the Out1 node, host device 210 determines that the Out1 node is dependent on the Gain2 node. Host device 210 further determines that the Gain2 node is dependent on the Integrator node output vector, y. As shown by reference number 545, host device 210 generates the ComputeY function identifying the blocks that are necessary to compute the model output vector, Y. For example, the Integrator block state vector (X) and the Gain2 block are the only blocks necessary to calculate the model output vector, Y. These blocks are determined to represent the ComputeY function, and host device 210 adds information identifying these blocks to the ComputeY function.

Figure 5D:
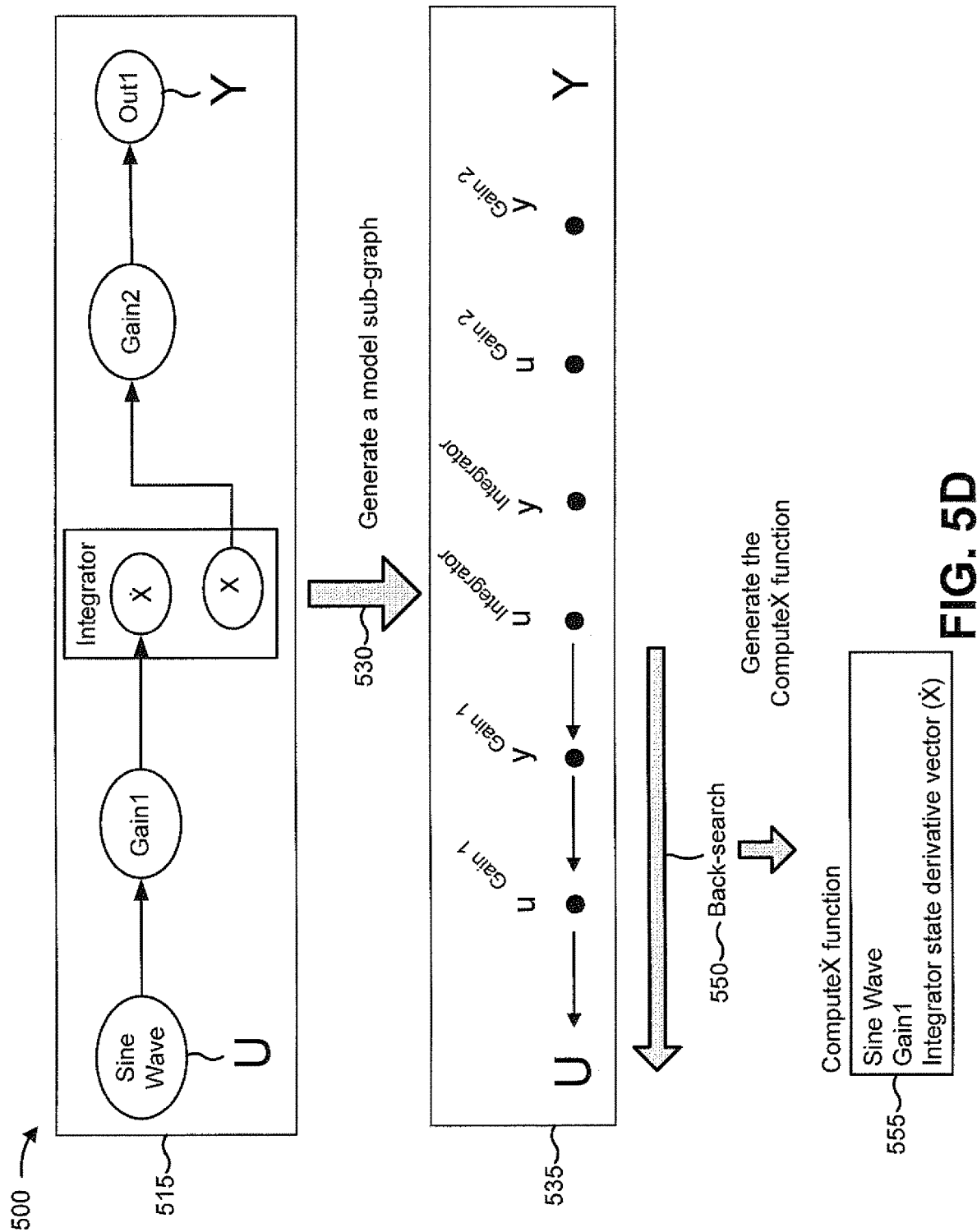

As shown in FIG. 5D, host device 210 may generate the Compute$\dot{X}$ function. For example, as shown by reference number 550, host device 210 may back search the model sub-graph from the Integrator node input vector, (e.g., u), through the nodes that the state derivative vector depends on, to identify the source node associated with the model input vector, U (e.g., the Sine Wave block). Searching backward from the Integrator block state derivative vector (e.g., $\dot{X}$), host device 210 determines that the Integrator node is dependent on the Gain1 node. Host device 210 further determines that the Gain1 node is dependent on the Sine Wave node. As shown by reference number 555, host device 210 generates the Compute$\dot{X}$ function identifying the nodes that are necessary to compute the model state derivative vector, $\dot{X}$ For example, the Integrator block state derivative vector ($\dot{X}$), the Gain1 block, and the Sine Wave block are the only blocks necessary to calculate the model derivative output vector, $\dot{X}$. These blocks are determined to represent the Compute$\dot{X}$ function, and host device 210 adds information identifying these blocks to the Compute$\dot{X}$ function.

As indicated above, FIGS. 5A-5D are provided merely as an example. Other examples are possible and may differ from what was described with respect to FIGS. 5A-5D.

Figure 6A:
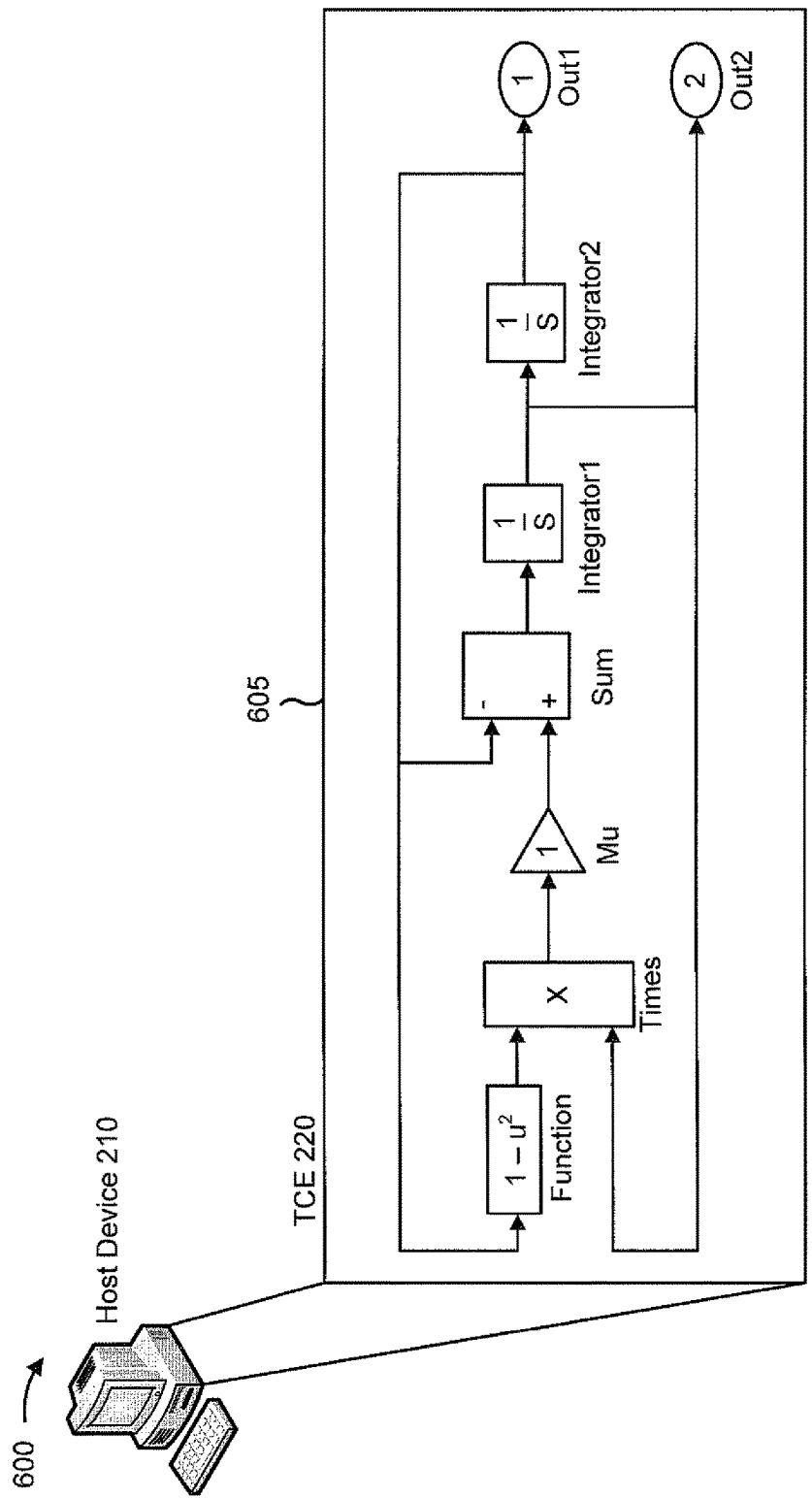
FIG. 6A-6D are diagrams of another example implementation relating to the example process shown in FIG. 4.

FIGS. 6A-6D are diagrams of another example implementation 600 relating to example process 400 shown in FIG. 4. As shown in FIG. 6A, assume that host device 210 receives a model. As shown by reference number 605, the model contains eight interconnected blocks, shown as a Function block, a Times block, a Mu block, a Sum block, an Integrator1 block, an Integrator2 block, an Out1 block, and an Out2 block.

Figure 6B:
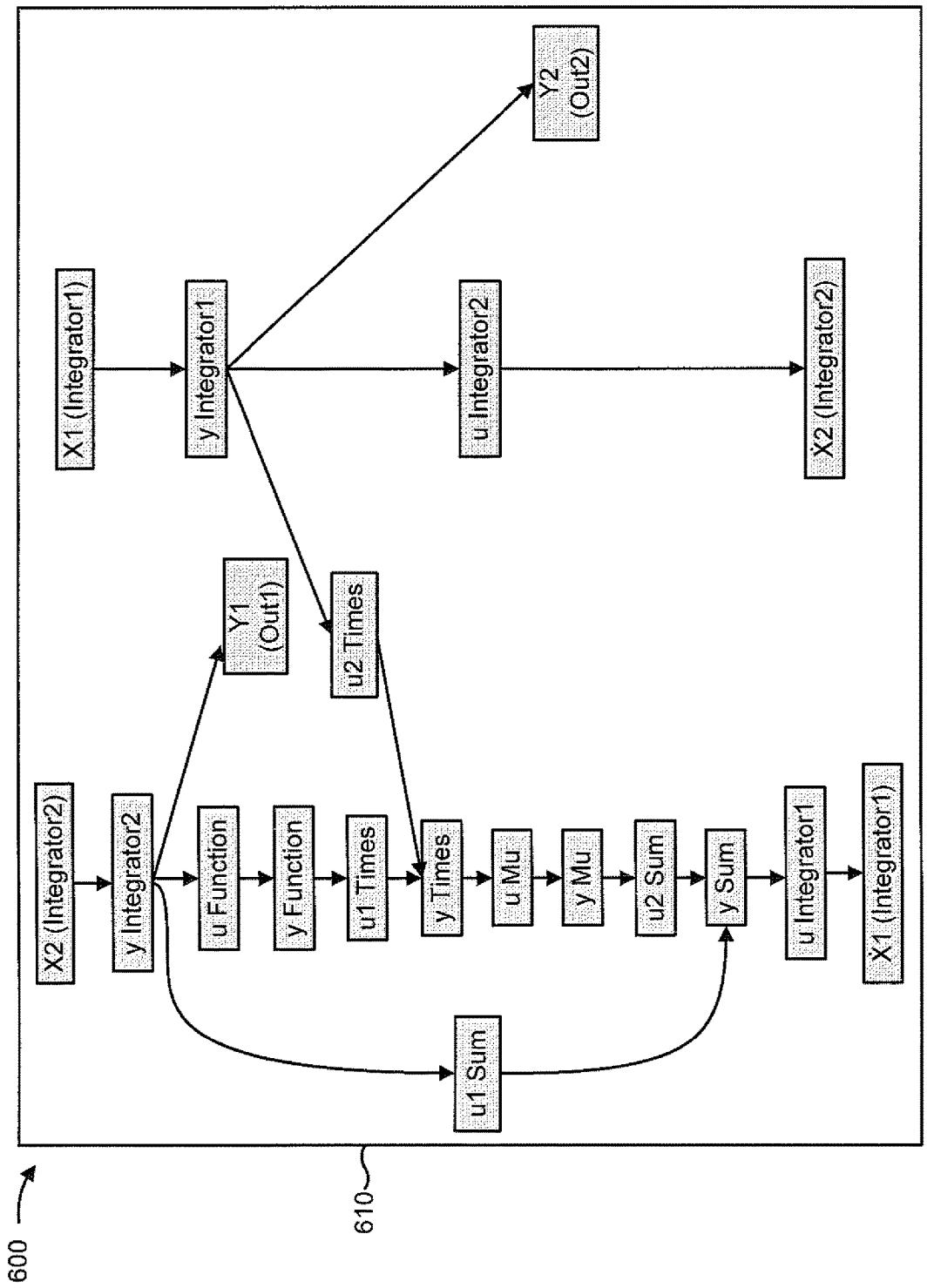

As shown in FIG. 6B, assume that host device 210 has determined the block variable dependencies and the model variable dependencies utilizing the Jacobian block pattern information associated with each block. Further, assume that host device 210 has generated the block sub-graph for each block in the model based on the block variable dependencies, and has generated the model sub-graph based on the model variable dependencies. As shown by reference number 610, the block and model dependencies are shown in the model sub-graph. For example, the model sub-graph shown by reference number 610 has two model output vectors (e.g., Y1, which represents the Out1 block, and Y2, which represents the Out2 block). The model sub-graph shows the dependencies between blocks as arrows connecting the nodes. For example, Y1 (e.g., the Out1 node) is dependent on the output vector of the Integrator2 node (e.g., y Integrator2). The output vector of the Integrator2 node is dependent on the state vector of the Integrator2 node (e.g., X2).

As further shown in FIG. 6B, host device 210 may determine the model source nodes and model sink nodes based on the dependencies shown in the generated model sub-graph. For example, as shown by reference number 610, host device 210 may determine the model source nodes (e.g., the state vectors X1 and X2) and the model sink nodes (e.g., the model output vectors, Y1 and Y2, and the derivative of state vectors, $\dot{X}$1 and $\dot{X}$2) from the model sub-graph.

Figure 6C:
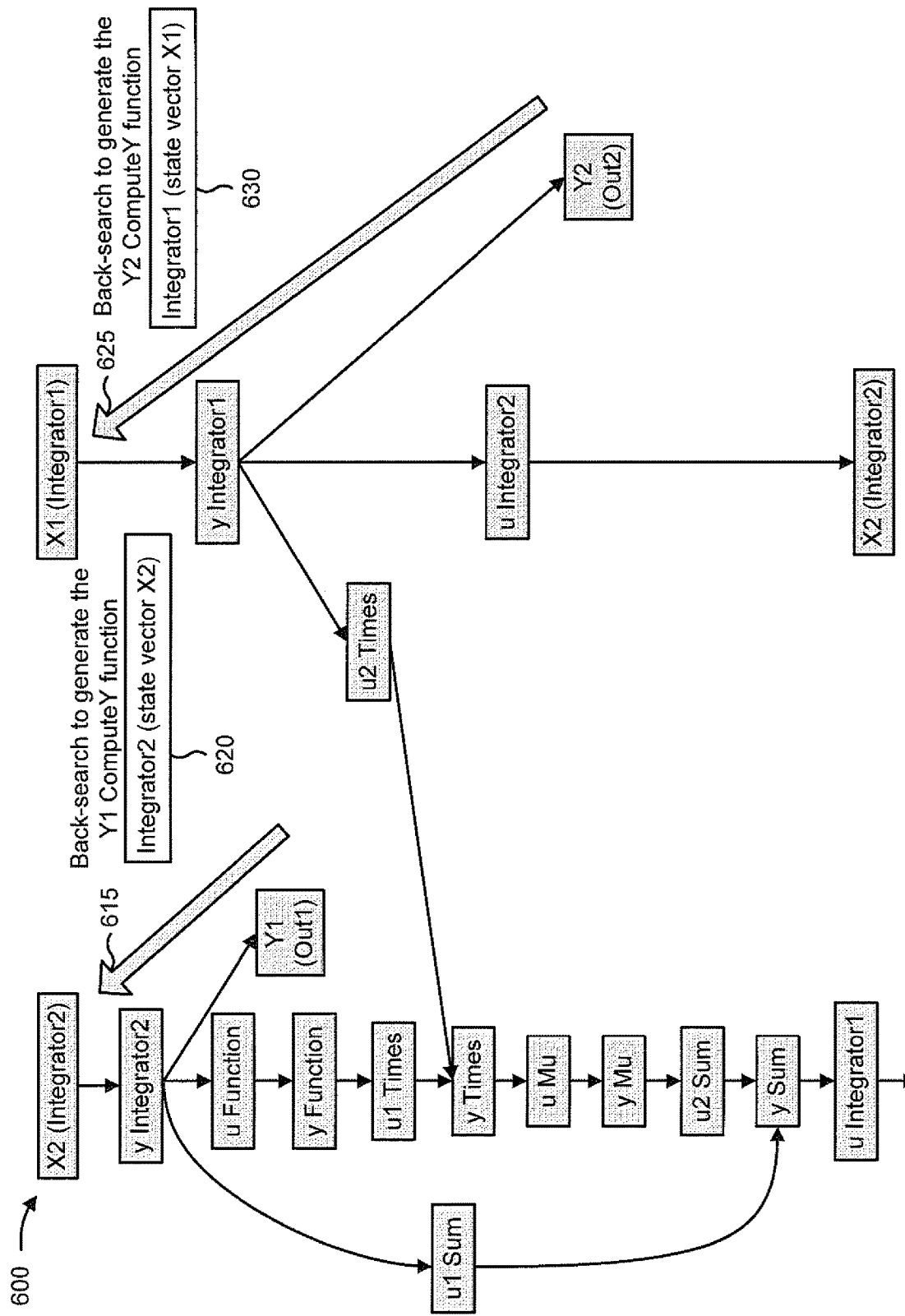

As shown in FIG. 6C, host device 210 may generate two ComputeY functions by back-searching from each of the two model output vectors (e.g., output vectors Y1 and Y2). For example, as shown by reference number 615, by back-searching the dependency path from Y1, host device 210 identifies a dependency on the output vector of Integrator2 node (e.g., y Integrator2). The output vector of an integrator block may be the same as the integrator block state vector (e.g., x). This relationship identifies the state vector of the Integrator2 node as the sole dependency required to calculate the model output vector, Y1. As shown by reference number 620, the ComputeY function for Y1 includes the state vector of the Integrator2 node.

As further shown in FIG. 6C, and by reference number 625, by back-searching the dependency path from Y2, host device 210 identifies a dependency on the output vector of Integrator1 node (e.g., y Integrator1). The output vector of an integrator block may be the same as the integrator block state vector (e.g., x). This relationship identifies the Integrator1 node state vector as the sole dependency required to calculate the model output vector, Y2. As shown by reference number 630, the ComputeY function for Y2 includes the state vector of the Integrator1 node.

Figure 6D:
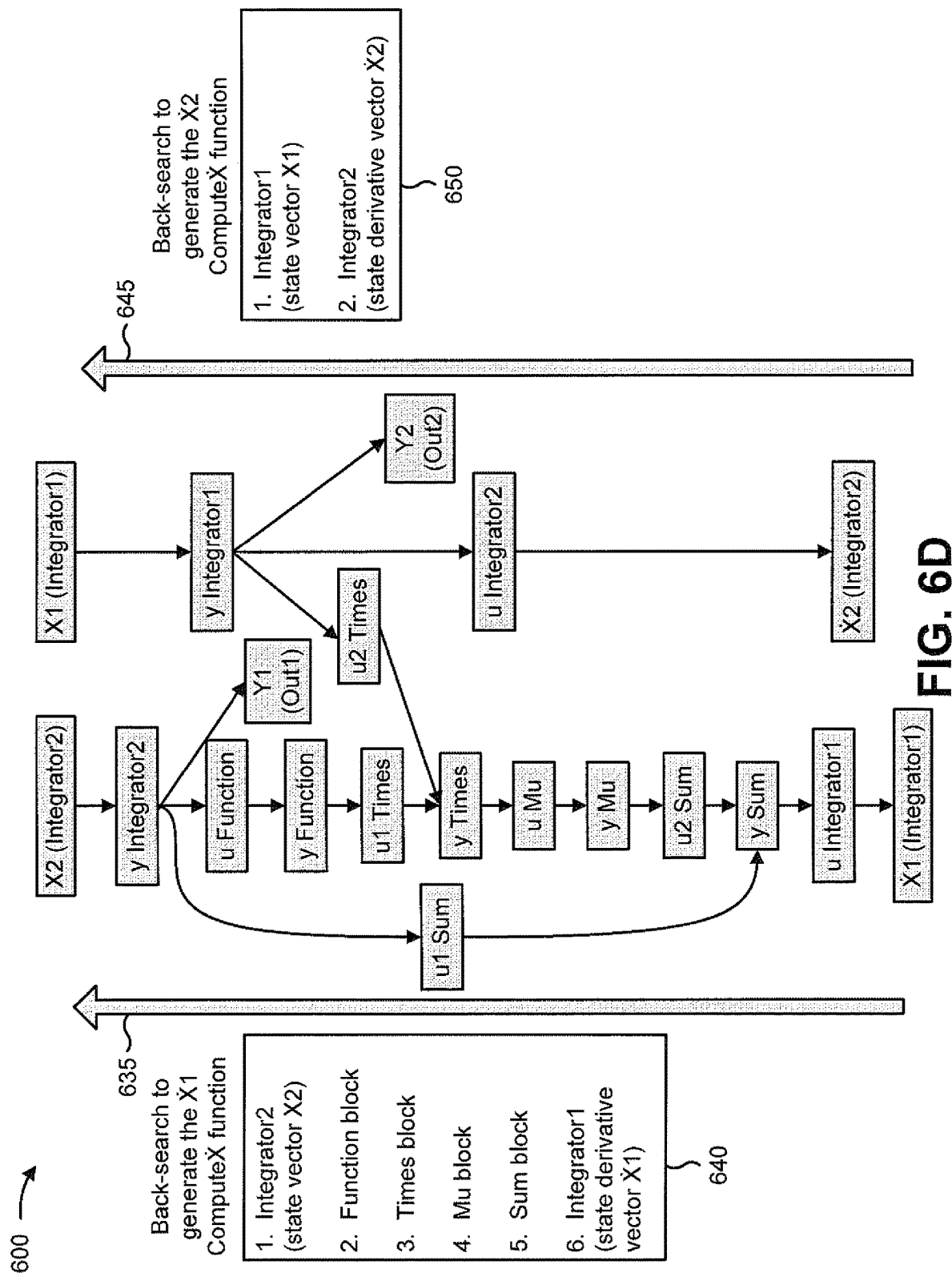

As shown in FIG. 6D, host device 210 may generate two ComputeẊ function by back-searching from each of the two model state derivative vectors (e.g., state derivative vectors Ẋ1 and Ẋ2). For example, as shown by reference number 635, by back-searching the dependency paths from Ẋ1, host device 210 identifies a dependency on the Integrator1 node, the Sum node, the Mu node, the Times node, the Function node, and the Integrator2 node. As shown by reference number 640, these nodes are included in the ComputeẊ function for Ẋ1.

As further shown in FIG. 6D, and by reference number 645, by back-searching the dependency paths from Ẋ2, host device 210 identifies a dependency on the Integrator2 node and the Integrator1 node. As shown by reference number 650, host device 210 identifies these nodes in the ComputeẊ function for Ẋ2.

As indicated above, FIGS. 6A-6D are provided merely as an example. Other examples are possible and may differ from what was described with regards to FIGS. 6A-6D.

FIG. 7A is a flow chart of an example process 700A for utilizing separate execution functions when executing a model. In some implementations, one or more process blocks of FIG. 7A may be performed by host device 210. In some implementations, one or more process blocks of FIG. 7A may be performed by another device or group of devices separate from host device 210, such as server device 230.

As shown in FIG. 7A, process 700A may include receiving an indication to execute a model (block 705). For example, host device 210 may receive an indication to execute a model. In some implementations, host device 210 may receive the indication to execute the model as user input to TCE 220. In some implementations, an indication to execute the model may be provided as programmatic instructions (e.g., program code) received from host device 210 or server device 230 utilizing network 240.

As further shown in FIG. 7A, process 700A may include obtaining a ComputeY function and a ComputeẊ function (block 710). For example, host device 210 may generate the ComputeY function and the ComputeẊ function based on receiving the indication to execute the model. In some implementations, a user may provide input, utilizing TCE 220, to generate the ComputeY function and the ComputeẊ function. In some implementations, TCE 220 may automatically generate the ComputeY function and the ComputeẊ function based on an attribute that is stored or associated with a particular model. Host device 210 may generate the ComputeY function and the ComputeẊ function as described herein in connection with FIG. 4. Additionally, or alternatively, host device 210 may retrieve the ComputeY function and/or the ComputeẊ function from memory.

In some implementations, host device 210 may generate one or more update execution functions (e.g., ComputeXd). Additionally, or alternatively, host device 210 may generate one or more zero-crossing execution functions (e.g., ComputeG). In some implementations, host device 210 may generate one or more execution functions to start, initialize, enable, or terminate functionality in a model. In some implementations, a user may specify or define the dependency between variables associated with these execution functions using a flag or programming construct.

In some implementations, host device 210 may generate program code representing a selected portion of the block diagram or the entire model. For example, host device 210 may generate program code comprising a ComputeY function and a ComputeẊ function based on receiving the indication to execute the model. In some implementations, host device 210 may generate program code that represents one or more update execution functions (e.g., ComputeXd). Additionally, or alternatively, host device 210 may generate program code that represents one or more zero-crossing execution functions (e.g., ComputeG). Additionally, or alternatively, host device 210 may generate program code that represents one or more execution functions to start, initialize, enable, or terminate functionality in a model. In some implementations, generated program code may include a flag or programming construct identifying a user-specified dependency between variables associated with these execution functions.

The program code may include, for example, code in a high-level programming language (e.g., C, C++, Ada, etc.), code that represents hardware descriptions of the block diagram portions in a language such as hardware description language (HDL), custom code in a format suitable for interpretation by third-party software, etc. Additionally, or alternatively, the program code may include code suitable for a particular hardware platform (e.g., a microprocessor, a microcontroller, a digital signal processor, etc.), a platform-independent assembly that can be re-targeted to another environment, just-in-time code that corresponds to sections of the block diagram for accelerated performance, etc.

As further shown in FIG. 7A, process 700A may include determining one or more solvers to be used to execute the model (block 715). For example, host device 210 may receive input from a user to determine that a particular solver is most appropriate to be used to execute the model and/or the different execution functions. In some implementations, host device 210 may automatically determine a particular solver based on characteristics of the model. A solver may include a component of TCE 220 that determines the time between simulation steps and/or applies a numerical method to solve a set of equations (e.g., ordinary differential equations) that represent the model blocks of the model, within a particular accuracy requirement.

For example, a solver may include a fixed-step solver or a variable-step solver. Both fixed-step and variable-step solvers compute the next simulation time as the sum of the current simulation time and a quantity known as the step size. With a fixed-step solver, the step size remains constant throughout the simulation. In contrast, with a variable-step solver, the step size can vary from step to step, depending on the model dynamics. In particular, a variable-step solver may increase or decrease the step size to meet an error tolerance (e.g., specified by a user).

Additionally, or alternatively, a solver may include a continuous-time solver or a discrete-time solver. A continuous-time solver may use numerical integration to compute a model's continuous-time states at the current time step based on the states at previous time steps and the state derivatives. A discrete-time solver may rely on the individual blocks to compute the values of the model's discrete-time states at each time step.

A continuous-time solver may subdivide the simulation time span into major and minor time steps, where a minor time step represents a subdivision of the major time step. The solver may produce a result (e.g., an output) at each major time step. The solver may use results at the minor time steps to improve the accuracy of the result at the major time step.

A discrete-time solver may be used to solve a purely discrete-time model. A discrete-time solver may compute the next simulation time step for a model, and nothing else. In performing these computations, a discrete-time solver may rely on each block in the model to update the block's individual discrete-time states. Discrete-time solvers may not compute continuous-time states.

Additionally, or alternatively, one or more solvers may be applied to simulate the model, and each solver may be responsible for calculations related to a portion of the model. For example, based on the dependencies in a model and the generated ComputeY function and ComputeẊ function, different solvers may be employed during execution of the model. In some implementations, a single solver may be used to execute the blocks in the ComputeY function and the ComputeẊ function when executing the model. In some implementations, a first solver may be used to execute the blocks in the ComputeY function, and a second solver (e.g., that is different from the first solver) may be used to execute the blocks in the ComputeẊ function when executing the model.

Additionally, or alternatively, one or more solvers may be used when a model has multiple model output vectors (e.g., Y1 and Y2) and multiple model state derivative vectors (e.g., and) 2). For example, TCE 220 may determine to employ a first solver (e.g., Solver A) to execute the blocks in the ComputeY function related to model output vector Y1. Additionally, or alternatively, TCE 220 may employ a second solver (e.g., Solver B) to execute the blocks in the ComputeY function related to model output vector Y2. Additionally, or alternatively, TCE 220 may employ a third solver (e.g., Solver C) to execute the blocks in the ComputeẊ function related to the model state derivative vector Ẋ1, and may employ a fourth solver (e.g., Solver D) to execute the blocks in the ComputeẊ function related to the model state derivative vector Ẋ2. These solvers may be utilized serially, in parallel, or via a combination of serial and parallel utilization.

As further shown in FIG. 7A, process 700A may assign model execution to one or more processors (block 720). For example, host device 210 may assign execution of the entire model or execution of portions of the model to one or more computing resources (e.g., processors). In some implementations, host device 210 may determine the availability of additional computing resources (e.g., processors) and assign model execution to one or more computing resources.

For example, host device 210 may determine the processing resources available (e.g., at host device 210, server device 230, and/or one or more other server devices 230). Assigning model execution to one or more processors may increase the speed of model execution. By leveraging the dependency data associated with portions of a model, the model may be partitioned into separate, non-dependent sub-units (e.g., a first sub-unit of blocks identified in the ComputeY function and a second sub-unit of blocks identified in the ComputeẊ function) that can be executed in parallel on one or more available processors. In some implementations, model sub-units may include virtual sub-systems, atomic subsystems, or model references. For example, a model may include three separable sub-units with no interdependence between sub-units. Each sub-unit may be assigned to three different processors for model execution.

Additionally, or alternatively, one or more processors may be assigned to execute the model, and each processor may be responsible for calculations related to a portion of the model. For example, based on the dependencies in the model and the generated ComputeY function and Compute function, different processors may be assigned to execute the model. In some implementations, a single processor may be assigned to execute the blocks in the ComputeY function and the ComputeẊ function when executing the model. In some implementations, a first processor may be assigned to execute the blocks in the ComputeY function, and a second processor (e.g., that is different from the first processor) may be assigned to execute the blocks in the ComputeẊ function when executing the model.

Additionally, or alternatively, one or more processors may be assigned when a model has multiple model output vectors (e.g., Y1 and Y2) and multiple model state derivative vectors (e.g., Ẋ1 and Ẋ2). For example, TCE 220 may assign a first processor (e.g., Processor A) to execute the blocks identified in the ComputeY function related to model output vector Y1. Additionally, or alternatively, TCE 220 may assign a second processor (e.g., Processor B) to execute the blocks identified in the ComputeY function related to model output vector Y2. Additionally, or alternatively, TCE 220 may assign a third processor (e.g., Processor C) to execute the blocks identified in the ComputeẊ function related to the model state derivative vector Ẋ1, and may assign a fourth processor (e.g., Processor D) to execute the blocks identified in the ComputeẊ function related to the model state derivative vector Ẋ2. In this way, multiple processors may be assigned to execute the model and the blocks identified in the ComputeY function and/or ComputeẊ function when the model possesses one or more separable sub-units. These processors may be utilized serially, in parallel, or via a combination of serial and parallel utilization. For example, a model may interact with multiple processors embodied in remote workers operating as part of a cloud-based computing network. In remote and/or distributed processing based implementations (e.g., cloud-based), host device 210 may include a browser-based interface to interact with remote/distributed processing resources.

In some implementations, host device 210 may identify available processing resources, and may schedule execution of the sub-units of the model on the available resources (e.g., using a scheduler, a load balancer, an optimizer, etc.). In some implementations, the scheduling may depend on the type of processing resource, such as a CPU, a GPU, an APU, etc.

As further shown in FIG. 7A, process 700A may include causing the model to be executed using the ComputeY function during major time steps and using the Compute function during minor time steps (block 725). For example, host device 210 may execute one or more sub-units of the model using a selected solver on a selected processor using the ComputeY function during the major time steps and using the ComputeẊ function during the minor time steps. Additionally, or alternatively, host device 210 may provide information associated with the model to one or more other devices (e.g., server device(s) 230) for execution, and may receive a result of the execution from the one or more other devices.

During model execution, TCE 220 may successively compute the states and outputs of the modeled system at intervals from the execution start time to the execution stop time, using information from the model. The successive time points at which the states and outputs are computed may be referred to as time steps. An interval of time between time steps may be referred to as a step size. The step size may depend on the type of solver used to compute the system's continuous states, the system's fundamental sample time, and/or whether the system's continuous states have discontinuities (e.g., zero-crossings). Additionally, or alternatively, the step size may be input by a user. For example, a user may provide a minimum and/or maximum step size to define time steps necessary to compute model outputs.

Model execution may include two sub-phases: a loop initialization phase and a loop iteration phase. The initialization phase may occur once, at the start of the execution loop. The iteration phase may be repeated once per time step from the execution start time to the execution stop time.

At the start of the execution, the model may specify the initial states and outputs of the system to be simulated. At each time step, new values for the system's inputs, states, and outputs may be computed, and the model may be updated to reflect the computed values. At the end of the execution, the model may reflect the final values of the system's inputs, states, and outputs.

At each time step, TCE 220 may compute the model's outputs, may compute the model's states, and may check for discontinuities in the continuous states of blocks and compute the time for the next time step. These computations may be repeated successively, until the execution stop time is reached.

During computation of the model's outputs, TCE 220 may invoke a model output method. The model output method may in turn invoke the model system output method, which may invoke the output methods of the blocks that the model contains in the order specified by the ComputeY function(s). A graphical model may represent a system and may contain virtual and non-virtual subsystems. The model represented as a system and the subsystems that may be included in the model may further include one or more execution functions (e.g., system output methods or system update methods).

During computation of the model's states, TCE 220 may compute the model's states using a solver. A solver used by TCE 220 may depend on whether the model has no states, only discrete-time states, only continuous-time states, or both continuous-time and discrete-time states.

If the model includes discrete-time states, TCE 220 may invoke a discrete-time solver (e.g., selected by a user). The solver may compute the size of the time step based on the model's sample times. The solver may then invoke an update method of the model. The model update method may in turn invoke the model system update method, which may invoke the update methods of each of the blocks that the system contains in the order specified by the ComputeXd function(s).

If the model includes continuous-time states, TCE 220 may invoke a continuous-time solver (e.g., specified by a user or the model). In some implementations, the solver may call the derivative method of the model once per time step. In some implementations, the solver enters a sub-cycle of minor time steps where the solver repeatedly calls the model's outputs methods and derivative methods to compute the model's outputs and derivatives at successive intervals within the major time step. This is done to increase the accuracy of the state computation. The model output method and derivative method may in turn invoke the corresponding system methods, which may invoke the block outputs and derivatives in the order specified by the ComputeY function(s) and the ComputeX function(s), respectively.

Additionally, or alternatively, TCE 220 may check for discontinuities in the continuous-time states of blocks employing a technique that may be referred to as zero-crossing detection. This technique is used to detect discontinuities in continuous-time states without the solver resorting to applying excessively small time steps to dynamically adjust the time step size when variables are changing rapidly in the vicinity of discontinuous values. In some implementations, TCE 220 may include blocks in a model that define their own state. Blocks may register a set of zero-crossing variables, each of which is a function of a state variable that may have a discontinuity. The zero-crossing function may pass through zero from a positive or negative value when the corresponding discontinuity occurs. The registered zero-crossing variables may be updated at the end of each simulation step, and any variable that has changed sign may be identified as having had a zero-crossing event.

In some implementations, model execution may proceed according to the ComputeY function(s) during the major time step and according to the ComputeX function(s) during the minor time step. In other words, host device 210 may execute the block(s) in the ComputeY function(s) during major time steps, and may execute the block(s) in the ComputeẊ function(s) during minor time steps. Additionally, or alternatively, model execution may be performed according to a zero-crossing execution function (e.g., ComputeG) when the execution includes zero-crossing variables. Host device 210 may execute the blocks in the order specified in the ComputeG function(s).

Model execution may be performed using the ComputeY function(s) and the ComputeẊ function(s) employing one or more solvers. In some implementations, a ComputeG function may be generated and assigned to a particular solver. Additionally, or alternatively, model execution may be performed using the ComputeY, Compute, and ComputeG functions employing one or more processors in conjunction with one or more solvers. Host device 210 may determine an execution result based on causing the model to be executed.

Although FIG. 7A show example blocks of process 700A, in some implementations, process 700A may include additional blocks, different blocks, fewer blocks, or differently arranged blocks than those depicted in FIG. 7A. Additionally, or alternatively, two or more of the blocks of process 700A may be performed in parallel.

Figure 7B:
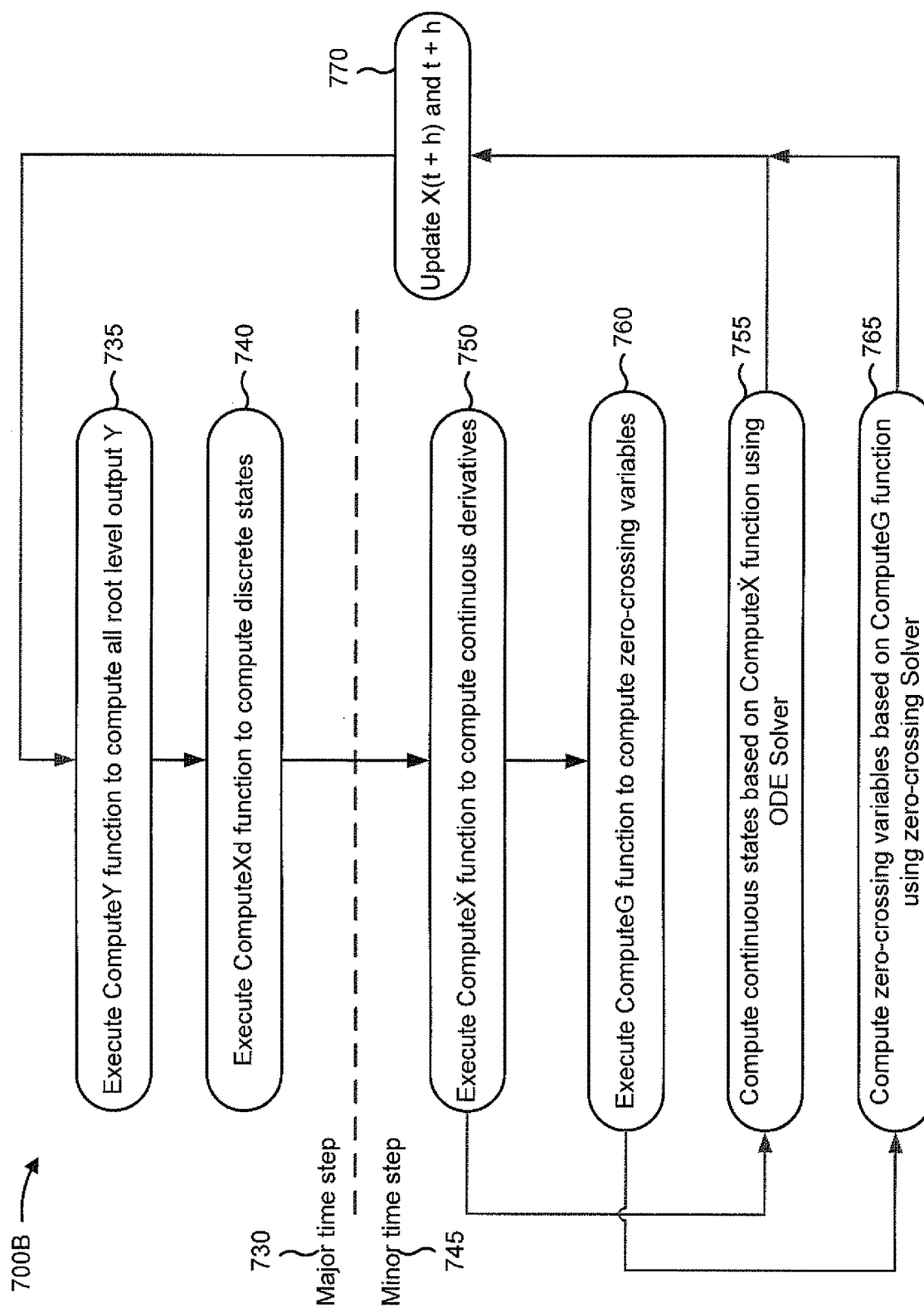

FIG. 7B is a flow chart of an example process 700B for utilizing execution functions during the loop iteration phase of model execution. In some implementations, one or more process blocks of FIG. 7B may be performed by host device 210. In some implementations, one or more process blocks of FIG. 7B may be performed by another device or a group of devices separate from or including host device 210, such as server device 230.

For the purpose of FIG. 7B, assume that one or more of blocks 705 through 720 in FIG. 7A have been performed. During the execution of the model that is indicated by block 725 of FIG. 7A, process 700B may be performed. As shown in FIG. 7B, process 700B may include computing execution functions during major time steps (as shown by reference number 730) and minor time steps (as shown by reference number 745) of the loop iteration phase of model execution.

As shown in FIG. 7B, process 700B may include executing ComputeY function(s) to compute root level outputs Y (block 735), and executing ComputeXd function(s) to compute discrete states (block 740). For example, during major time steps, host device 210 may execute ComputeY and ComputeXd functions. Host device 210 may execute one or more ComputeY functions to compute all root level outputs for the model. For example, host device 210 may execute a ComputeY function for multiple root level outputs in a model (e.g., Y1, Y2, etc.). Additionally, or alternatively, host device 210 may execute one or more ComputeXd functions to compute discrete states in a model. For example, host device 210 may execute a ComputeXd function to compute discrete states of a block or blocks in a model.

As shown by reference number 745, host device 210 may compute one or more execution functions during a minor time step of the loop iteration phase of model execution. For example, host device 210 may compute executions functions for continuous derivatives and zero-crossing variables during minor time steps of the loop iteration phase of model execution.

As further shown in FIG. 7B, process 700B may include executing ComputeẊ function(s) to compute continuous derivates (block 750), and computing continuous states based on the ComputeẊ function(s) using an ODE solver (block 755). For example, host device 210 may execute one or more ComputeẊ functions to compute continuous derivatives for any block or blocks in the model possessing derivative equations. For example, host device 210 may execute a ComputeẊ function for multiple root level derivative equations in a model (e.g., Ẋ1, Ẋ2, etc.). Host device 210 may utilize an ordinary differential equation (ODE) solver to compute continuous states using the ComputeẊ function.

As further shown in FIG. 7B, process 700B may include executing ComputeG function(s) to compute zero-crossing variable (block 760), and computing zero-crossing variables based on the ComputeG function(s) using a zero-crossing solver (block 765). For example, host device 210 may execute one or more ComputeG functions to compute zero-crossing variables. For example, host device 210 may execute a ComputeG function for any block or blocks in the model possessing zero-crossing variables or zero-crossing functions. Host device 210 may utilize a zero-crossing solver to compute the zero-crossing variables based on the ComputeG function.

As further shown in FIG. 7B, process 700B may include updating the continuous states and the zero-crossing variables (block 770). For example, hose device 210 may update the continuous states and zero-crossing variables based on a function of time (t) and step size (h). For example, host device 210 may update a model to a new state vector, X, while advancing execution time, t, and based on the step size, h. Host device 210 may continue executing in this manner for each execution step.

Although FIG. 7B show example blocks of process 700B, in some implementations, process 700B may include additional blocks, different blocks, fewer blocks, or differently arranged blocks than those depicted in FIG. 7B. Additionally, or alternatively, two or more of the blocks of process 700B may be performed in parallel.

Figure 8A:
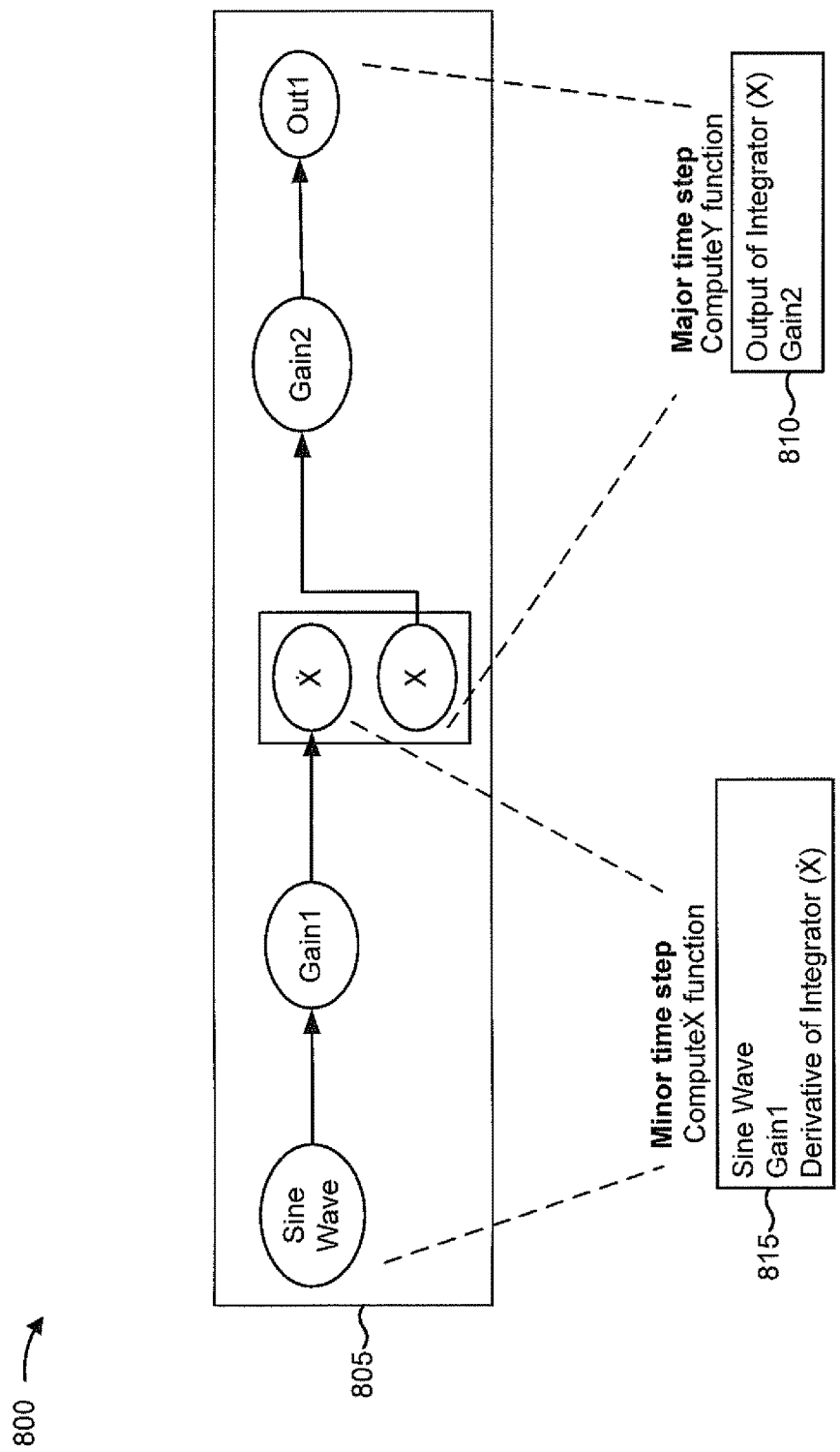
FIGS. 8A and 8B are diagrams of an example implementation relating to the example processes shown in FIGS. 7A and 7B.
Figure 8B:
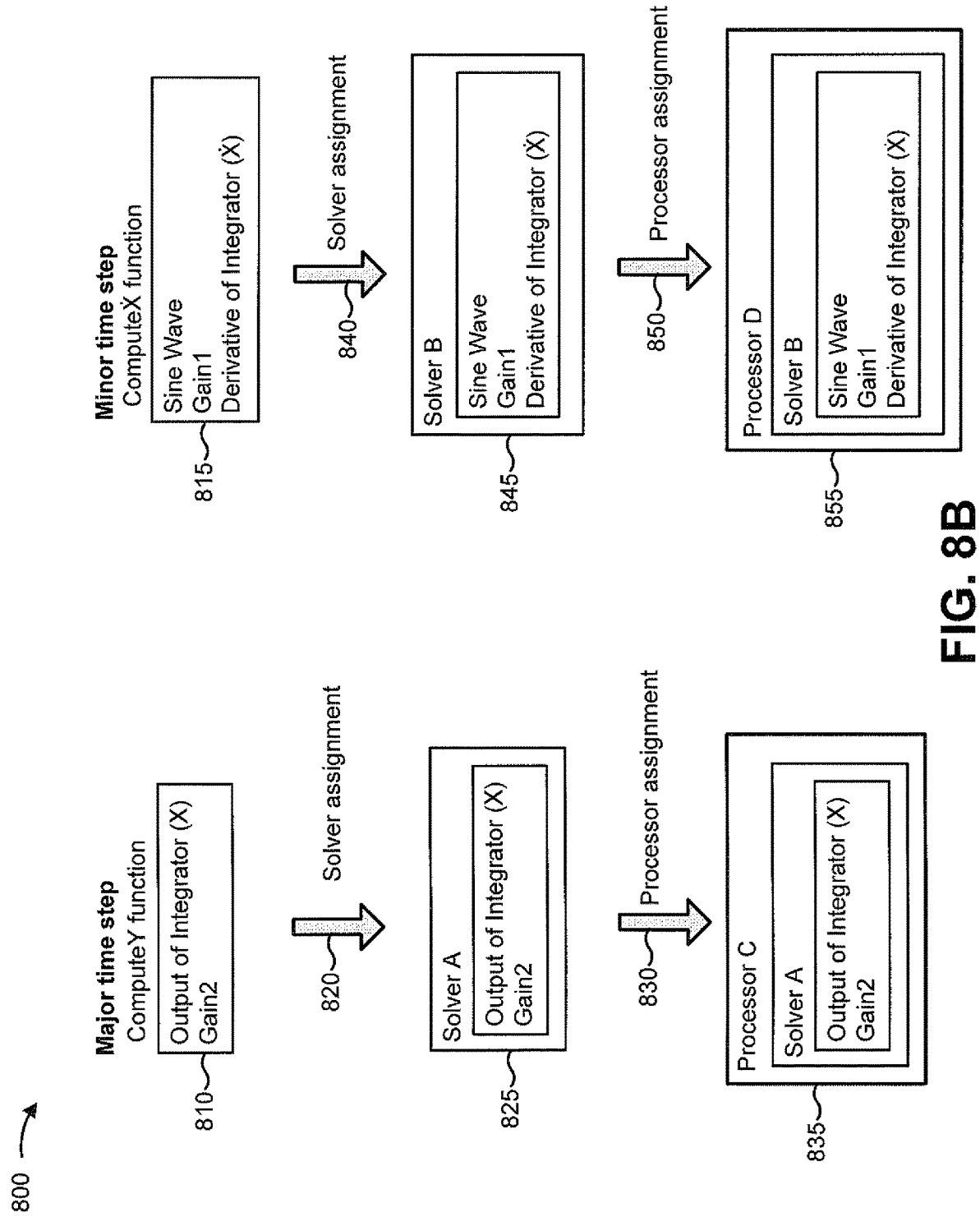

FIGS. 8A and 8B are diagrams of an example implementation 800 relating to example processes 700A and 700B shown in FIGS. 7A and 7B. For the purpose of FIG. 8A, assume that host device 210 has received an indication to execute a model. As shown by reference number 805, the model and block dependencies have been determined and a model sub-graph has been generated. As shown by reference number 810, TCE 220 has determined the ComputeY function based on the generated model sub-graph. The ComputeY function may be executed during each major time step of model execution. As shown by reference number 815, TCE 220 has determined the ComputeẊ function based on the generated model sub-graph. The Compute function may be executed during each minor time step of model execution.

As shown in FIG. 8B, and by reference number 820, the generated ComputeY function may be assigned to a particular solver. As shown by reference number 825, Solver A may be utilized to perform calculations related to the ComputeY function. As shown by reference number 830, the ComputeY function utilizing Solver A may be assigned to a particular processor. As shown by reference number 835, Processor C may execute the portion of the model identified by the ComputeY function utilizing Solver A.

As further shown in FIG. 8B, and by reference number 840, the generated ComputeẊ function may be assigned to a particular solver. As shown by reference number 845, Solver B may be utilized to perform calculations related to the ComputeẊ function. As shown by reference number 850, the ComputeẊ function utilizing Solver B may be assigned to a particular processor. As shown by reference number 855, Processor D may execute the portion of the model identified by the ComputeẊ function utilizing Solver B.

As indicated above, FIGS. 8A and 8B are provided merely as an example. Other examples are possible and may differ from what was described with regards to FIGS. 8A and 8B.

FIGS. 9A-9D are diagrams of another example implementation 900 relating to example processes 700A and 700B shown in FIGS. 7A and 7B. FIGS. 9A-9D show an example of generating program code for execution functions.

Figure 9A:
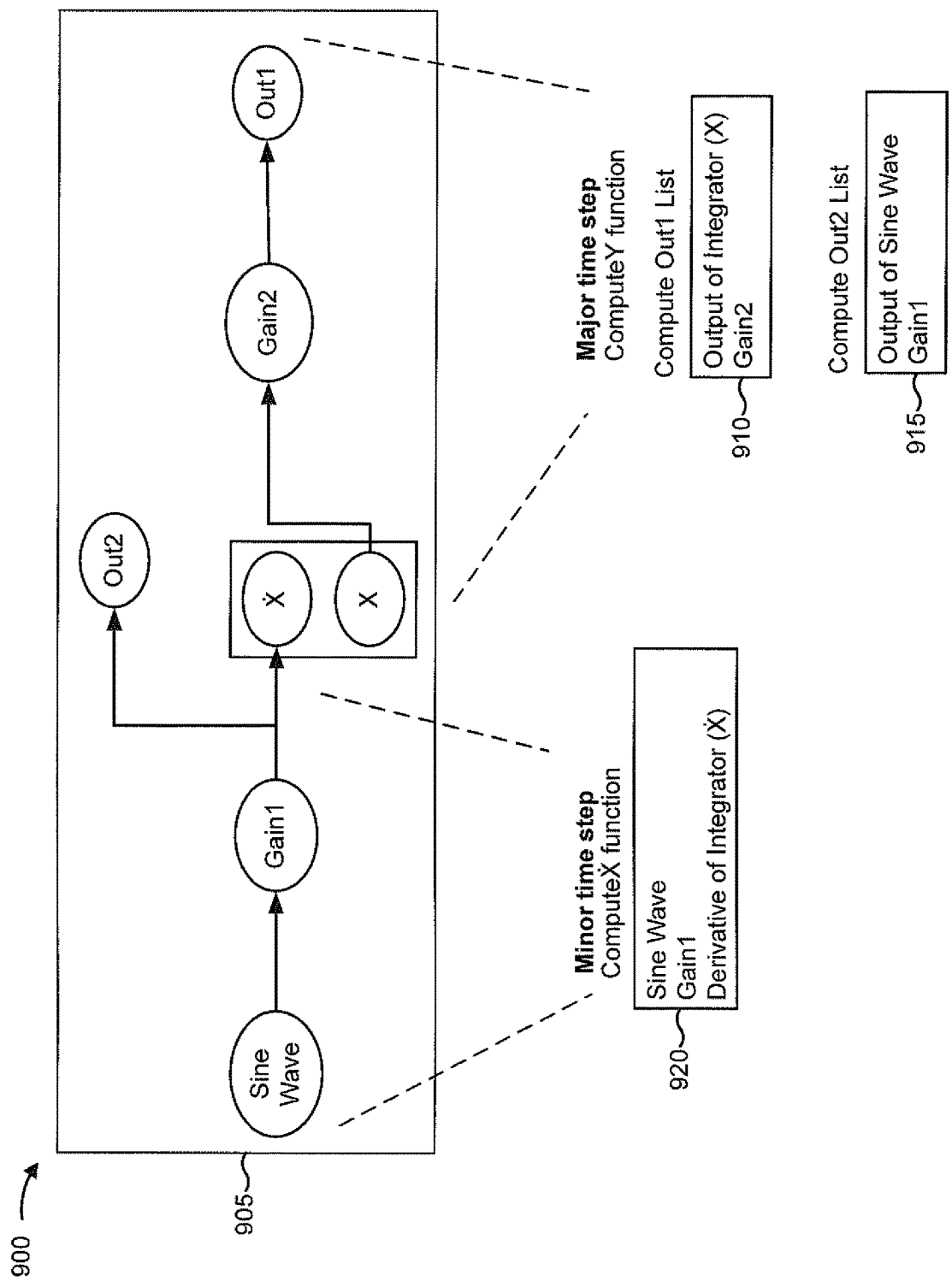

For the purpose of FIG. 9A, assume that host device 210 has received an indication to execute a model. As shown by reference number 905, the model and block dependencies have been determined and a model sub-graph has been generated. One or more ComputeY function lists may be obtained based on the root level model outputs and the dependencies of the model sub-graph. As shown by reference number 910, host device 210 has obtained the ComputeY function list for Out1 based on the generated model sub-graph. As shown by reference number 915, host device has obtained the ComputeY function list for Out2 based on the generated model sub-graph. One or more ComputeY function lists may be executed during each major time step of model execution.

As shown by reference number 920, host device 210 has obtained the Compute function based on the generated model sub-graph. One or more ComputeẊ function lists may be obtained based on the root level model outputs and the dependencies of the model sub-graph. One or more ComputeẊ function lists may be executed during each minor time step of model execution.

Host device 210 may generate program code comprising one or more execution function lists. For example, after receiving an indication to execute a model, the block and model dependencies may be determined and a model sub-graph may be generated. Host device 210 may obtain the execution function lists, and may generate program code representing the block and model dependencies. More efficient code may be generated by determining the block and model dependencies.

As shown in FIG. 9B, assume model and block dependencies were not determined to obtain execution functions for the model. As shown by reference 925, generated program code representing the variables of all blocks in model sub-graph 905 comprises execution functions for all blocks in the model. In this case, host device 210 obtains execution functions for each block in model sub-graph 905. The generated program code may be less efficient due to the excessive processing required to calculate the model variables for non-dependent model sub-graph nodes.

As shown by reference 930, the generated program code representing the ComputeY function includes a single list with portions of code relating to every model sub-graph node. When host device 210 has not determined block and model dependencies, the ComputeY function includes execution function code relating to each block in the model, including those blocks that may not be associated with data dependencies. Due to this method, execution function lists may not be assigned to one or more solvers or one or more processors for further execution. Additionally, or alternatively, the generated program code may not be executed in parallel on one or more processors.

As shown by reference 935, the generated program code representing the ComputeẊ function may include execution function code relating to non-dependent model sub-graph nodes. For example, reference 935 identifies generated program code for calculating the ComputeẊ function. When host device 210 has not determined block and model dependencies, the generated code representing the ComputeẊ function execution list includes execution function code relating to the Integrator node and the Gain1 node. However, neither the Integrator node nor the Gain1 node contributes a data dependency to the root derivative, Ẋ. The generated program code may be more inefficient as a result of not determining block and model dependencies.

As shown in FIG. 9C, assume model and block dependencies have been determined to obtain execution functions for the model. As shown by reference 940, the generated program code may include one or more ComputeY function lists. As shown by reference 945, two ComputeY function lists have been obtained relating to Out1 node and Out2 node in the model sub-graph. The ComputeY1 function list and the ComputeY2 function list may be assigned to one or more solvers or one or more processors for further execution.

As shown in FIG. 9D, assume model and block dependencies have been determined to obtain execution functions for the model. As shown by reference 950, the generated program code representing the ComputeẊ function may include execution function code relating to model sub-graph nodes with data dependencies. As shown by reference number 955, the generated program code does not include the output of the Integrator node and the output of the Gain2 node because these nodes do not contribute data dependencies to the calculation of the ComputeẊ function list. In this way, program code generated based on determining model and block dependencies may be more efficiently executed than program code generated without determining model and block dependencies.

As indicated above, FIGS. 9A-9D are provided merely as an example. Other examples are possible and may differ from what was described with regards to FIGS. 9A-9D.

The foregoing disclosure provides illustration and description, but is not intended to be exhaustive or to limit the implementations to the precise form disclosed. Modifications and variations are possible in light of the above disclosure or may be acquired from practice of the implementations.

As used herein, a component is intended to be broadly construed as hardware, firmware, or a combination of hardware and software.

As used herein, program code (sometimes referred to as code) is to be broadly interpreted to include text-based code that may not require further processing to execute (e.g., C++ code, Hardware Description Language (HDL) code, very-high-speed integrated circuits (VHSIC) HDL (VHDL) code, Verilog code, Java code, another type of hardware and/or software based code that may be compiled and/or synthesized, etc.), binary code that may be executed (e.g., executable files that may be directly executed by an operating system, bitstream files that may be used to configure an FPGA, Java byte code, object files combined together with linker directives, source code, makefiles, etc.), text files that may be executed in conjunction with other executables (e.g., Python text files, Octave files, a collection of dynamic-link library (DLL) files with text-based combining, configuration information that connects pre-compiled modules, an extensible markup language (XML) file describing module linkage, etc.), source code (e.g., readable by a human), machine code (e.g., readable by a machine), or the like. In some implementations, program code may include different combinations of the above-identified classes of code (e.g., text-based code, binary code, text files, source code, machine code, etc.). Additionally, or alternatively, program code may include code generated using a dynamically-typed programming language (e.g., the M language, a MATLAB® language, a MATLAB-compatible language, a MATLAB-like language, etc.) that may be used to express problems and/or solutions using mathematical notations. Additionally, or alternatively, program code may be of any type, such as a function, a script, an object, etc.

It will be apparent that systems and/or methods, as described herein, may be implemented in many different forms of software, firmware, and hardware in the implementations illustrated in the figures. The actual software code or specialized control hardware used to implement these systems and/or methods is not limiting of the implementations. Thus, the operation and behavior of the systems and/or methods were described without reference to the specific software code—it being understood that software and control hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, as "set" is intended to include one or more items, and may be used interchangeably with "one or more." Where only one item is intended, the term "one" or similar language is used. Further, the phrase "based on" is intended to mean "based, at least in part, on" unless explicitly stated otherwise.

What is claimed is:

1. A device comprising:
one or more processors to:
obtain a model that includes a plurality of blocks,
the model representing a time-based dynamic system,
the model including first variables that contribute to a first calculation and second variables that contribute to a second calculation,
the plurality of blocks including a given block having a given first variable that contributes to the first calculation and a given second variable that contributes to the second calculation, and
the first calculation and the second calculation being computable using separate execution functions;
identify dependencies among the plurality of blocks of the model based on a data dependency graph, the data dependency graph being generated based on patterns of variables associated with each of the plurality of blocks of the model;

determine first dependencies among the first variables based on the dependencies among the plurality of blocks of the model;

determine second dependencies among the second variables based on the dependencies among the plurality of blocks of the model;

generate a first execution function based on the first calculation and the determining the first dependencies, the first execution function identifying calculations associated with a first set of blocks of the plurality of blocks, including the given block, that are to be executed as part of the first execution function;

generate a second execution function, that is executable in parallel with the first execution function, based on the second calculation and the determining the second dependencies, the second execution function identifying calculations associated with a second set of blocks of the plurality of blocks, including the given block, that are to be executed as part of the second execution function; and cause the first set of blocks, identified by the first execution function, and the second set of blocks, identified by the second execution function, to be executed in a different manner and in parallel based on the first execution function and the second execution function.

2. The device of claim 1, where the one or more processors are further to:

cause a first solver to be used to execute the first set of blocks identified by the first execution function; and cause a second solver to be used to execute the second set of blocks identified by the second execution function.

3. The device of claim 2, where the first solver is different from the second solver.

4. The device of claim 1, where the first calculation includes a first type of calculation, the first type of calculation including at least one of:
an output calculation,
an update calculation,
a derivative calculation, or
a zero-crossing calculation; and where the second calculation includes a second type of calculation that is different from the first type of calculation.

5. The device of claim 1, where the first execution function includes a first plurality of functions, and where the second execution function includes a second plurality of functions that are different from the first plurality of functions.

6. The device of claim 1, where the one or more processors, when generating the first execution function, are to:

generate first program code that represents the first execution function; and where the one or more processors, when generating the second execution function, are to:

generate second program code that represents the second execution function.

7. A non-transitory computer-readable medium storing instructions, the instructions comprising:

one or more instructions that, when executed by one or more processors, cause the one or more processors to:

obtain a model that includes a plurality of blocks, the model representing a time-based dynamic system, the model including first variables that contribute to a first calculation and second variables that contribute to a second calculation, the plurality of blocks including a given block having a given first variable that contributes to the first calculation and a given second variable that contributes to the second calculation, and the first calculation and the second calculation being computable using separate execution functions;

identify dependencies among the plurality of blocks of the model based on a data dependency graph, the data dependency graph being generated based on patterns of variables associated with each of the plurality of blocks of the model;

determine first dependencies among the first variables based on the dependencies among the plurality of blocks of the model;

determine second dependencies among the second variables based on the dependencies among the plurality of blocks of the model;

generate a first execution function based on the first calculation and the determining the first dependencies, the first execution function identifying calculations associated with a first set of blocks of the plurality of blocks, including the given block, that are to be executed as part of the first execution function;

generate a second execution function, that is executable in parallel with the first execution function, based on the second calculation and the determining the second dependencies, the second execution function identifying calculations associated with a second set of blocks of the plurality of blocks, including the given block, that are to be executed as part of the second execution function; and cause the first set of blocks, identified by the first execution function, and the second set of blocks, identified by the second execution function, to be executed in a different manner and in parallel based on the first execution function and the second execution function.

8. The non-transitory computer-readable medium of claim 7, where the instructions further comprise:

one or more instructions that, when executed by the one or more processors, cause the one or more processors to:

determine a block sub-graph for each block of the plurality of blocks, the block sub-graph indicating a relationship between at least two variables included in a first block of the plurality of blocks;

determine a model sub-graph for the model based on the block sub-graph, the model sub-graph indicating a relationship between a variable represented by the first block and a variable represented by a second block of the plurality of blocks; and determine the first dependencies and the second dependencies based on the model sub-graph.

9. The non-transitory computer-readable medium of claim 7, where the instructions further comprise:

one or more instructions that, when executed by the one or more processors, cause the one or more processors to:

determine a first block associated with a model input vector or a model state vector;
determine a second block associated with a model output vector or a derivative of the model state vector; and
generate the first execution function and the second execution function based on determining the first block and the second block.

10. The non-transitory computer-readable medium of claim 7, where the instructions further comprise:
one or more instructions that, when executed by the one or more processors, cause the one or more processors to:
determine a first block associated with a model input vector or a model state vector;
determine a second block associated with a model output vector;
determine at least one block, of the plurality of blocks, that depends from the first block and from which the second block depends; and
generate the first execution function by including information identifying the at least one block in the first execution function.

11. The non-transitory computer-readable medium of claim 7, where the instructions further comprise:
one or more instructions that, when executed by the one or more processors, cause the one or more processors to:
determine a first block associated with a model input vector or a model state vector;
determine a second block associated with a derivative of the model state vector;
determine at least one block, of the plurality of blocks, that depends from the first block and from which the second block depends; and
generate the second execution function by including information identifying the at least one block in the second execution function.

12. The non-transitory computer-readable medium of claim 7, where the instructions further comprise:
one or more instructions that, when executed by the one or more processors, cause the one or more processors to:
execute the first set of blocks, identified by the first execution function, during a first time step of model execution; and
execute the second set of blocks, identified by the second execution function, during a second time step of model execution.

13. The non-transitory computer-readable medium of claim 7, where the instructions further comprise:
one or more instructions that, when executed by the one or more processors, cause the one or more processors to:
cause a first processor to be used to execute the first set of blocks identified by the first execution function; and
cause a second processor to be used to execute the second set of blocks identified by the second execution function.

14. A method, comprising:
obtaining a model that includes a plurality of executable model elements,
the model representing a time-based dynamic system,
the model including first variables that contribute to a first calculation and second variables that contribute to a second calculation,
the plurality of executable model elements including a given executable model element having a given first variable that contributes to the first calculation and a given second variable that contributes to the second calculation, and
the first calculation and the second calculation being computable using separate execution functions, and
the obtaining the model being performed by one or more devices;
identifying dependencies among the plurality of executable model elements of the model based on a data dependency graph,
the data dependency graph being generated based on patterns of variables associated with each of the plurality of executable model elements of the model, and
the identifying the dependencies being performed by the one or more devices;
determining first dependencies among the first variables based on the dependencies among the plurality of executable model elements,
the determining the first dependencies being performed by the one or more devices;
determining second dependencies among the second variables based on the dependencies among the plurality of executable model elements,
the determining the second dependencies being performed by the one or more devices;
generating a first execution function based on the first calculation and the first dependencies,
the first execution function identifying calculations associated with a first set of executable model elements of the plurality of executable model elements, including the given executable model element, that are to be executed as part of the first execution function, and
the generating the first execution function being performed by the one or more devices;
generating a second execution function, that is executable in parallel with the firsts execution function, based on the second calculation and the second dependencies,
the second execution function identifying calculations associated with a second set of executable model elements of the plurality of executable model elements, including the given executable model element, that are to be executed as part of the second execution function, and
the generating the second execution function being performed by the one or more devices;
causing the model to be executed using the first execution function and the second execution function,
the causing the model to be executed comprising:
causing the first set of executable model elements to be executed to perform the first calculation, and
causing the second set of executable model elements to be executed to perform the second calculation in parallel with execution of the first set of executable model elements, and
the causing the model to be executed being performed by the one or more devices; and
determining an execution result based on causing the model to be executed,
the determining the execution result being performed by the one or more devices.

15. The method of claim 14, further comprising:
  determining a model element sub-graph for each executable model element of the plurality of executable model elements,
    the model element sub-graph indicating a relationship between at least two variables included in a first executable model element of the plurality of executable model elements;
  determining a model sub-graph for the model based on the model element sub-graph,
    the model sub-graph indicating a relationship between a variable included in the first executable model element and a variable included in a second executable model element of the plurality of executable model elements; and
  determining the first dependencies and the second dependencies based on the model sub-graph.

16. The method of claim 14, further comprising:
  determining a first executable model element, of the plurality of executable model elements, associated with a model input vector or a model state vector;
  determining a second executable model element, of the plurality of executable model elements, associated with a model output vector or a derivative of the model state vector; and
  generating the first execution function and the second execution function based on determining the first executable model element and the second executable model element.

17. The method of claim 16, where the second executable model element is associated with the model output vector; and
  the method further comprises:
    determining at least one executable model element, of the plurality of executable model elements, that depends from the first executable model element and from which the second executable model element depends; and
    generating the first execution function by including information identifying the at least one executable model element in the first execution function.

18. The method of claim 16, where the second executable model element is associated with the derivative of the model state vector; and
  the method further comprises:
    determining at least one executable model element, of the plurality of executable model elements, that depends from the first executable model element and from which the second executable model element depends; and
    generating the second execution function by including information identifying the at least one executable model element in the second execution function.

19. The method of claim 14, where the first calculation includes one of:
  an output calculation,
  an update calculation,
  a derivative calculation, or
  a zero-crossing calculation; and
  where the second calculation includes a different one of:
    the output calculation,
    the update calculation,
    the derivative calculation, or
    the zero-crossing calculation.

20. The device of claim 1, where the one or more processors are further to:
  determine whether a time step of model execution is a major time step of model execution or a minor time step of model execution; and
  selectively cause the first set of blocks, identified by the first execution function, or the second set of blocks, identified by the second execution function, to be executed based on determining whether the time step of model execution is the major time step of model execution or the minor time step of model execution,
    only the first set of blocks being executed and first inputs, first states, and first outputs being generated for the time-based dynamic system, when the time step of model execution is the major time step of model execution, and
    only the second set of blocks being executed and second inputs, second states, and second outputs being generated for the time-based dynamic system, when the time step of model execution is the minor time step of model execution.

21. The method of claim 14, further comprising:
  determining whether a time step of model execution is a major time step of model execution or a minor time step of model execution; and
  selectively causing the first set of executable model elements, identified by the first execution function, or the second set of executable model elements, identified by the second execution function, to be executed based on determining whether the time step of model execution is the major time step of model execution or the minor time step of model execution,
    only the first set of executable model elements being executed and first inputs, first states, and first outputs being generated for the time-based dynamic system, when the time step of model execution is the major time step of model execution, and
    only the second set of executable model elements being executed and second inputs, second states, and second outputs being generated for the time-based dynamic system, when the time step of model execution is the minor time step of model execution.

* * * * *